(12) United States Patent
Kondo

(10) Patent No.: US 11,890,881 B2
(45) Date of Patent: Feb. 6, 2024

(54) ELECTRONIC DEVICE

(71) Applicant: SEIKO EPSON CORPORATION, Tokyo (JP)

(72) Inventor: Yoichiro Kondo, Chino (JP)

(73) Assignee: Seiko Epson Corporation, Tokyo (JP)

( * ) Notice: Subject to any disclaimer, the term of this patent is extended or adjusted under 35 U.S.C. 154(b) by 1 day.

(21) Appl. No.: 17/817,004

(22) Filed: Aug. 2, 2022

(65) Prior Publication Data
US 2023/0039603 A1 Feb. 9, 2023

(30) Foreign Application Priority Data
Aug. 3, 2021 (JP) ................................. 2021-127418

(51) Int. Cl.
*B41J 29/377* (2006.01)
*B41J 2/335* (2006.01)
*B41J 2/14* (2006.01)
*H05K 7/20* (2006.01)

(52) U.S. Cl.
CPC ........... *B41J 29/377* (2013.01); *B41J 2/3358* (2013.01); *B41J 2/1408* (2013.01); *B41J 2202/08* (2013.01); *H05K 7/20* (2013.01); *H05K 7/20154* (2013.01); *H05K 7/20163* (2013.01)

(58) Field of Classification Search
CPC ...... B41J 29/377; B41J 2/3358; B41J 2/1408; B41J 2202/08; H05K 7/20; H05K 7/20154; H05K 7/20163
See application file for complete search history.

(56) References Cited

U.S. PATENT DOCUMENTS

2008/0144282 A1* 6/2008 Sugahara ............. H05K 1/0272
361/689
2021/0023847 A1* 1/2021 Kachi ..................... B41J 13/226

FOREIGN PATENT DOCUMENTS

JP 2007-276174 10/2007
WO WO-0004752 A1 * 1/2000 ......... H05K 7/20163

* cited by examiner

*Primary Examiner* — Henok D Legesse
(74) *Attorney, Agent, or Firm* — WORKMAN NYDEGGER

(57) ABSTRACT

An electronic device including a substrate, a first electronic component provided on the substrate, a second electronic component provided on the substrate and having a thickness in a normal direction of the substrate smaller than that of the first electronic component, a first heat conductive member in contact with the first electronic component, a second heat conductive member in contact with the second electronic component, and a heat sink attached to the substrate, in which the heat sink includes a base portion provided so as to cover the first electronic component and the second electronic component and attached to the substrate, a first protruding portion that protrudes from the base portion toward the first electronic component and is in contact with the first heat conductive member, and a second protruding portion that protrudes from the base portion toward the second electronic component and is in contact with the second heat conductive member, and a length of the first protruding portion in the normal direction is shorter than a length of the second protruding portion in the normal direction.

11 Claims, 15 Drawing Sheets

| [SIH, SIL] | [1, 1]<br>LD | [1, 0]<br>SD | [0, 1]<br>ND | [0, 0]<br>BSD |
|---|---|---|---|---|
| S1 | H | L | L | L |
| S2 | L | H | L | L |
| S3 | L | L | L | H |

ELECTRONIC DEVICE

The present application is based on, and claims priority from JP Application Serial Number 2021-127418, filed Aug. 3, 2021, the disclosure of which is hereby incorporated by reference herein in its entirety.

BACKGROUND

1. Technical Field

The present disclosure relates to an electronic device.

2. Related Art

In an electronic device such as a liquid discharge device, a circuit element included in the electronic device generates heat due to a current generated when performing various controls. The heat generated in such a circuit element may change the characteristics of peripheral circuit elements including the circuit element, and also causes deterioration of the peripheral circuit elements including the circuit element. As a result, there is a possibility that the stability of the operation of the electronic device and the reliability of the electronic device may be decreased. Therefore, the electronic device is required to efficiently release heat generated in the circuit element.

For example, JP-A-2007-276174 describes a printing device, as an example of an electronic device, that includes a head unit which has a head discharging ink onto paper using a piezo element and an original drive signal generation portion for applying a drive signal to the piezo element, and a drive signal generation portion outputting the drive signal, and in which a plurality of transistors which can generate heat when outputting the drive signal are provided on a substrate included in the drive signal generation portion outputting the drive signal. In JP-A-2007-276174, a technique is disclosed in which an upper surface of the transistor, which can generate heat when outputting the drive signal, is in contact with a bottom surface of a heat sink, the heat sink has a fan and a cavity, and the fan blows air into the cavity to increase the cooling efficiency of the heat sink and to increase the cooling efficiency of the transistor.

A plurality of heat-generating electronic components including the transistors are provided in the electronic device, and the size and dimensions thereof differ depending on the type, structure, and characteristics of the element. However, JP-A-2007-276174 does not describe any technique for radiating heat generated in the plurality of electronic components having different sizes and dimensions by the heat sink, and there is room for improvement from this viewpoint.

SUMMARY

According to an aspect of the present disclosure, there is provided an electronic device including a substrate, a first electronic component provided on the substrate, a second electronic component provided on the substrate and having a thickness in a normal direction of the substrate smaller than that of the first electronic component, a first heat conductive member in contact with the first electronic component, a second heat conductive member in contact with the second electronic component, and a heat sink attached to the substrate, in which the heat sink includes a base portion provided so as to cover the first electronic component and the second electronic component and attached to the substrate, a first protruding portion that protrudes from the base portion toward the first electronic component and is in contact with the first heat conductive member, and a second protruding portion that protrudes from the base portion toward the second electronic component and is in contact with the second heat conductive member, and a length of the first protruding portion in the normal direction is shorter than a length of the second protruding portion in the normal direction.

DESCRIPTION OF EXEMPLARY EMBODIMENTS

Hereinafter, preferred embodiments of the present disclosure will be described with reference to the drawings. The drawings used are for convenience of description. The embodiments described below do not unreasonably limit the content of the present disclosure described in the aspects. In addition, not all of the configurations described below are essential constituent requirements of the present disclosure.

Hereinafter, as an example of an electronic device according to the present disclosure, a liquid discharge device that discharges a liquid to a medium will be described as an example, but the present disclosure is not limited thereto, and for example, may be various electronic devices such as a personal computer, a projector, and a television.

1. First Embodiment

1.1 Configuration of Liquid Discharge Device

Figure 1:
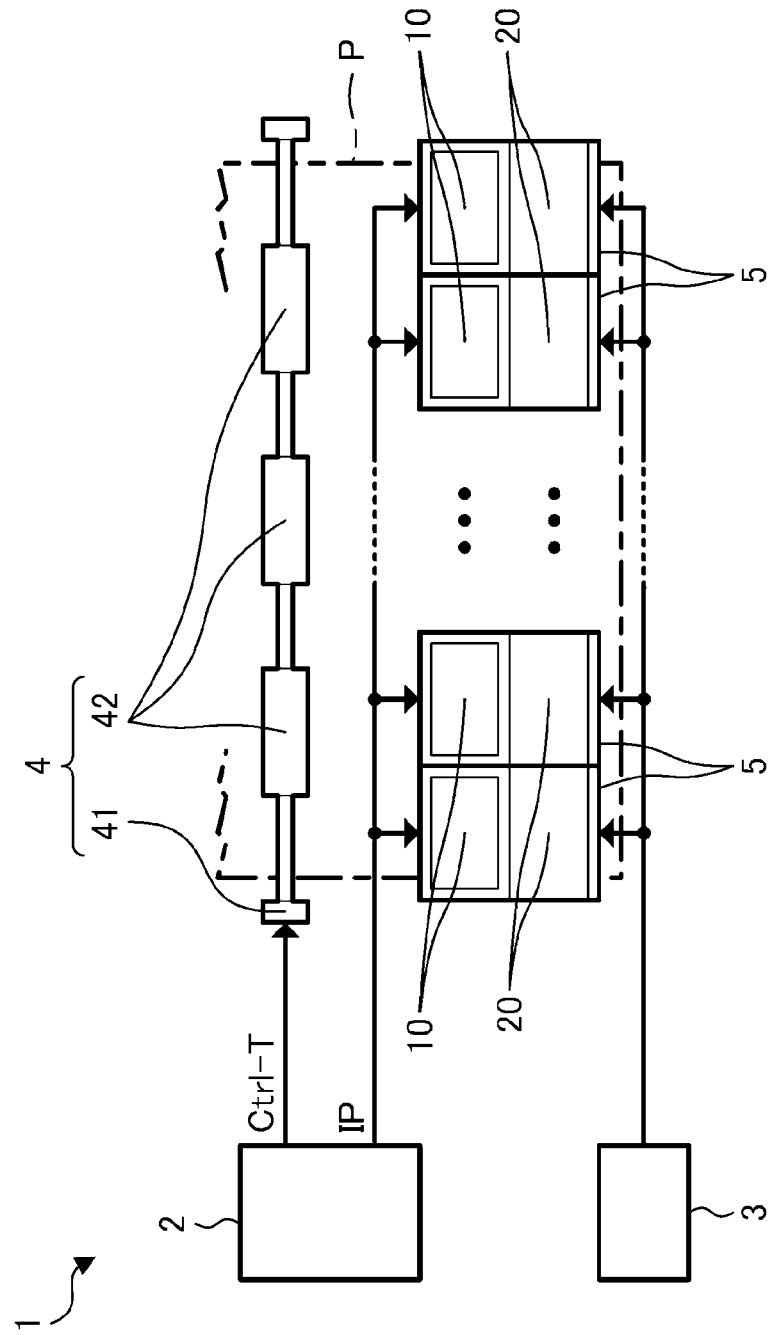
FIG. 1 is a diagram illustrating a schematic configuration of a liquid discharge device which is an example of an electronic device.

FIG. 1 is a diagram illustrating a schematic configuration of a liquid discharge device 1 which is an example of an electronic device. As illustrated in FIG. 1, the liquid discharge device 1 is a so-called line-type ink jet printer that forms a desired image on a medium P by discharging ink, which is an example of a liquid, at a desired timing on the medium P transported by a transport unit 4. Here, in the following description, a direction where the medium P is transported may be referred to as a transport direction, and a width direction of the transported medium P may be referred to as a main scanning direction.

As illustrated in FIG. 1, the liquid discharge device 1 is provided with a control unit 2, a liquid container 3, a transport unit 4, and a plurality of discharge units 5.

The control unit 2 includes a processing circuit such as a central processing unit (CPU) and a field programmable gate array (FPGA), and a storage circuit such as a semiconductor memory. The control unit 2 outputs a signal for controlling each element of the liquid discharge device 1 based on image data supplied from an external device such as a host computer (not illustrated) provided outside the liquid discharge device 1.

The ink as an example of the liquid supplied to the discharge unit 5 is stored in the liquid container 3. Specifically, the liquid container 3 stores inks of a plurality of colors discharged on the medium P, such as black, cyan, magenta, yellow, red, and gray.

The transport unit 4 includes a transport motor 41 and a transport roller 42. A transport control signal Ctrl-T output by the control unit 2 is input to the transport unit 4. The transport motor 41 operates based on the input transport control signal Ctrl-T, and the transport roller 42 is rotationally driven along with the operation of the transport motor 41, so that the medium P is transported along the transport direction.

Each of the plurality of discharge units 5 includes a head drive module 10 and a liquid discharge module 20. An image information signal IP output by the control unit 2 is input to the discharge unit 5, and the ink stored in the liquid container 3 is supplied. The head drive module 10 controls the operation of the liquid discharge module 20 based on the image information signal IP input from the control unit 2, and the liquid discharge module 20 discharges the ink supplied from the liquid container 3 on the medium P according to the control of the head drive module 10.

Here, the liquid discharge device 1 in the first embodiment constitutes a line-type ink jet printer. Specifically, the liquid discharge modules 20 included in each of the plurality of discharge units 5 are located side by side along the main scanning direction so as to be equal to or larger than the width of the medium P, and are provided so that ink can be discharged to the entire region in the width direction of the transported medium P. The liquid discharge device 1 is not limited to the line-type ink jet printer.

Figure 2A:
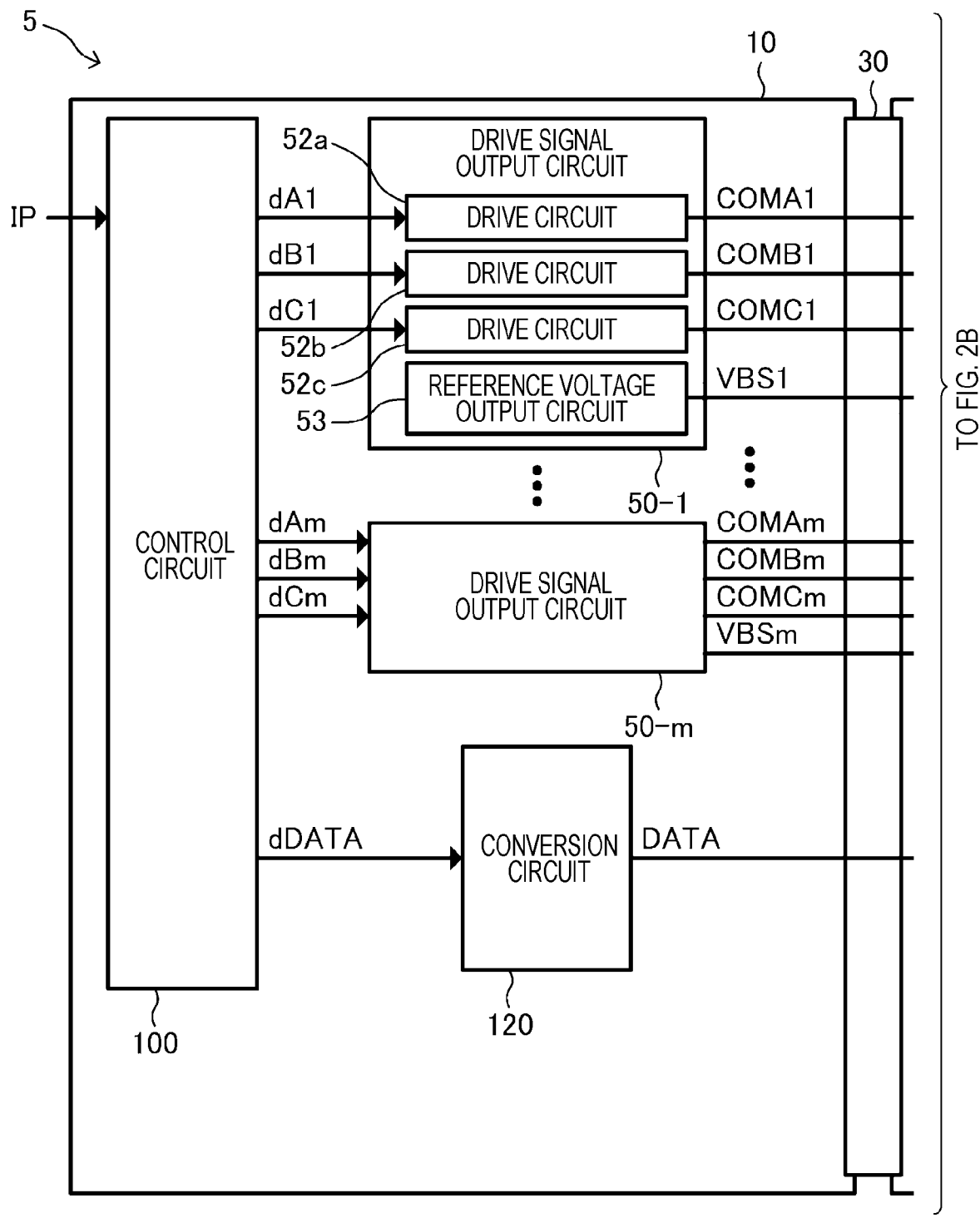
FIGS. 2A and 2B are diagrams illustrating a schematic configuration of a discharge unit.
Figure 2B:
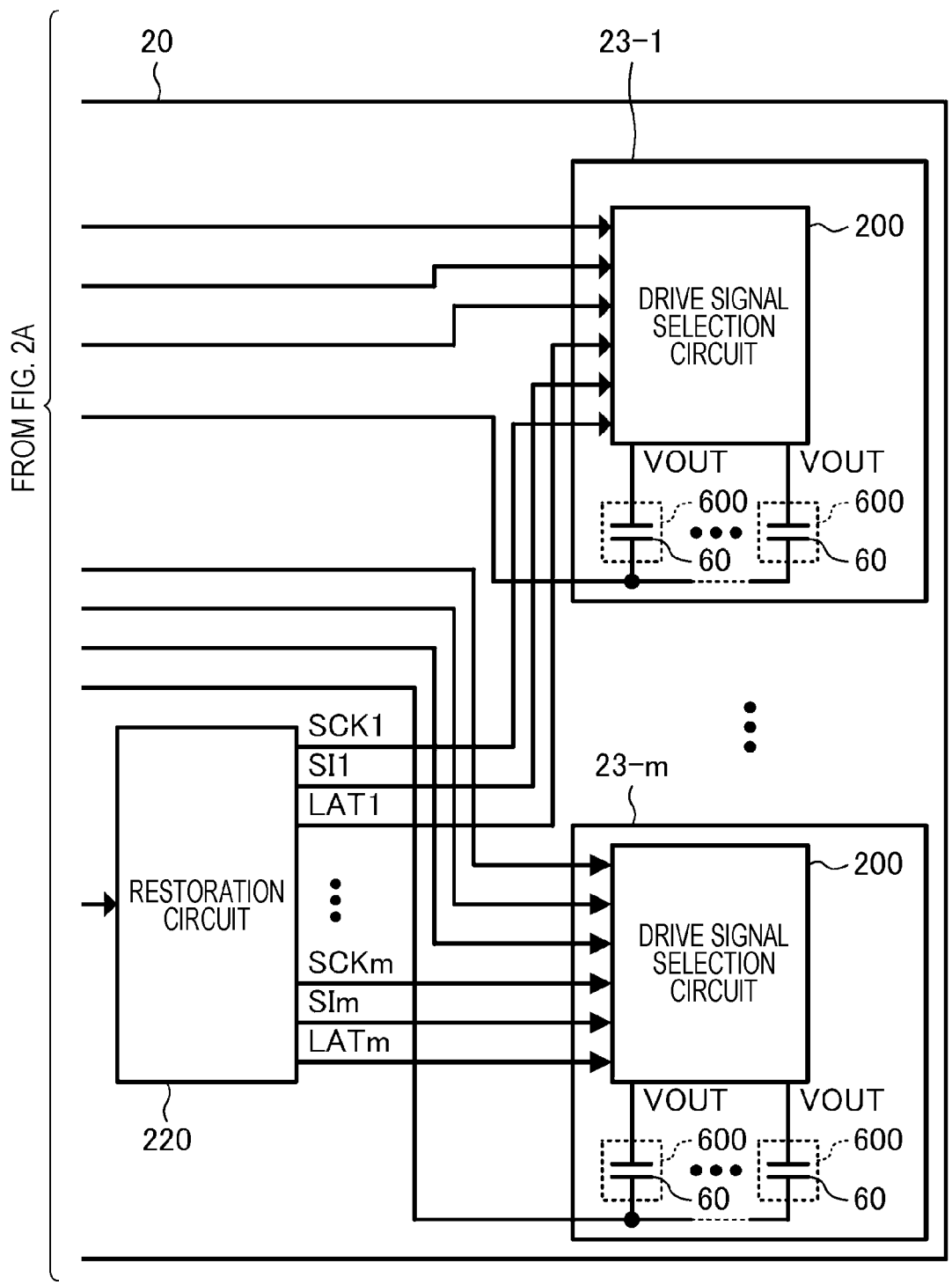

Next, a schematic configuration of the discharge unit 5 will be described. FIGS. 2A and 2B are diagrams illustrating a schematic configuration of the discharge unit 5. As illustrated in FIGS. 2A and 2B, the discharge unit 5 includes the head drive module 10 and the liquid discharge module 20. In addition, in the discharge unit 5, the head drive module 10 and the liquid discharge module 20 are electrically coupled by a wiring member 30.

The wiring member 30 is a flexible member for electrically coupling the head drive module 10 and the liquid discharge module 20, and is, for example, flexible printed circuits (FPC) or a flexible flat cable (FFC). The head drive module 10 and the liquid discharge module 20 do not have the FPC or the FFC, and may be electrically coupled to each other by, for example, a board to board (B to B) connector.

The head drive module 10 includes a control circuit 100, a drive signal output circuit 50-1 to 50-$m$, and a conversion circuit 120.

The control circuit 100 includes a CPU, FPGA, or the like. The image information signal IP output by the control unit 2 is input to the control circuit 100. The control circuit 100 outputs a signal for controlling each element of the discharge unit 5 based on the input image information signal IP.

The control circuit 100 generates a basic data signal dDATA for controlling the operation of the liquid discharge module 20 based on the image information signal IP, and outputs the basic data signal dDATA to the conversion circuit 120. The conversion circuit 120 converts the basic data signal dDATA into a differential signal such as low voltage differential signaling (LVDS) and outputs a data signal DATA to the liquid discharge module 20. The conversion circuit 120 may convert the basic data signal dDATA into a differential signal of a high-speed transfer method such as low voltage positive emitter coupled logic (LVPECL) or current mode logic (CML) other than LVDS and output the differential signal as the data signal DATA to the liquid discharge module 20, and may output a part or all of the input basic data signal dDATA as a single-ended data signal DATA to the liquid discharge module 20.

In addition, the control circuit 100 outputs basic drive signals dA1, dB1, and dC1 to the drive signal output circuit 50-1. The drive signal output circuit 50-1 includes drive circuits 52$a$, 52$b$, and 52$c$. The basic drive signal dA1 is input to the drive circuit 52$a$. The drive circuit 52$a$ generates a drive signal COMM by performing digital/analog conversion of the input basic drive signal dA1 and then amplifying in class D, and outputs the drive signal COMA1 to the liquid discharge module 20. The basic drive signal dB1 is input to the drive circuit 52$b$. The drive circuit 52$b$ generates a drive signal COMB1 by performing digital/analog conversion of the input basic drive signal dB1 and then amplifying in class D, and outputs the drive signal COMB1 to the liquid discharge module 20. The basic drive signal dC1 is input to the drive circuit 52$c$. The drive circuit 52$c$ generates a drive signal COMC1 by performing digital/analog conversion of the input basic drive signal dC1 and then amplifying in class D, and outputs the drive signal COMC1 to the liquid discharge module 20.

Here, each of the drive circuits 52$a$, 52$b$, and 52$c$ may generate the drive signals COMA1, COMB1, and COMC1 by amplifying the waveforms defined by each of the input basic drive signals dA1, dB1, and dC1, and may include a class A amplifier circuit, a class B amplifier circuit, a class AB amplifier circuit, or the like in place of the class D amplifier circuit or in addition to the class D amplifier circuit. In addition, each of the basic drive signals dA1, dB1, and dC1 may be an analog signal as long as the waveforms of the corresponding drive signals COMA1, COMB1, and COMC1 can be defined.

In addition, the drive signal output circuit 50-1 includes a reference voltage output circuit 53. The reference voltage output circuit 53 generates a reference voltage signal VBS1 having a constant potential indicating the reference potential of a piezoelectric element 60 described later included in the liquid discharge module 20, and outputs the reference voltage signal VBS1 to the liquid discharge module 20. The reference voltage signal VBS1 may be, for example, a ground potential or a constant potential such as 5.5V or 6V. Here, the constant potential includes a case where it can be regarded as a substantially constant potential when an error such as a fluctuation of the potential caused by the operation of the peripheral circuit, a fluctuation of the potential caused by variations in the circuit element, and a fluctuation of the potential caused by temperature characteristics of the circuit element is taken into consideration.

The drive signal output circuits 50-2 to 50-$m$ have the same configuration as the drive signal output circuit 50-1, except that the input signal and the output signal are different. That is, the drive signal output circuit 50-$j$ (j is any one of 1 to m) includes a circuit corresponding to the drive circuits 52$a$, 52$b$, and 52$c$ and a circuit corresponding to the reference voltage output circuit 53, generates drive signals COMAj, COMBj, and COMCj and a reference voltage signal VBSj based on the basic drive signals dAj, dBj, and dCj input from the control circuit 100, and outputs the drive signals and the reference voltage signal to the liquid discharge module 20.

Here, in the following description, the drive circuits 52$a$, 52$b$, and 52$c$ included in the drive signal output circuit 50-1 and the drive circuits 52$a$, 52$b$, and 52$c$ included in the drive signal output circuit 50-$j$ have the same configuration, and when it is not necessary to distinguish the drive circuits, the drive circuits may be simply referred to as a drive circuit 52. In this case, the drive circuit 52 will be described as generating and outputting a drive signal COM based on the basic drive signal do. On the other hand, when distinguishing between the drive circuits 52$a$, 52$b$, and 52$c$ included in the drive signal output circuit 50-1 and the drive circuits 52$a$, 52$b$, and 52$c$ included in the drive signal output circuit 50-$j$, the drive circuits 52$a$, 52$b$, and 52$c$ included in the drive signal output circuit 50-1 may be referred to as drive circuits 52$a$1, 52$b$1, and 52$c$1, and the drive circuits 52$a$, 52$b$, and 52$c$ included in the drive signal output circuit 50-$j$ may be referred to as drive circuits 52$aj$, 52$bj$, and 52$cj$.

The liquid discharge module 20 includes a restoration circuit 220 and discharge modules 23-1 to 23-$m$.

The restoration circuit 220 restores the data signal DATA to a single-ended signal, separates the data signal DATA into signals corresponding to each of the discharge modules 23-1 to 23-$m$, and outputs the data signals to the corresponding discharge modules 23-1 to 23-$m$.

Specifically, the restoration circuit 220 restores and separates the data signal DATA to generate a clock signal SCK1, a print data signal SI1, and a latch signal LAT1 corresponding to the discharge module 23-1, and outputs these signals to the discharge module 23-1. In addition, the restoration circuit 220 restores and separates the data signal DATA to generate a clock signal SCKj, a print data signal SIj, and a latch signal LATj corresponding to the discharge module 23-$j$, and outputs these signals to the discharge module 23-$j$.

As described above, the restoration circuit 220 restores the data signal DATA of the differential signal output by the head drive module 10, and separates the restored signal into signals corresponding to the discharge modules 23-1 to 23-$m$. As a result, the restoration circuit 220 generates the clock signals SCK1 to SCKm, the print data signals SI1 to SIm, and the latch signals LAT1 to LATm corresponding to each of the discharge modules 23-1 to 23-$m$, and outputs these signals to the corresponding discharge modules 23-1 to 23-$m$. Any one of the clock signals SCK1 to SCKm, the print data signals SI1 to SIm, and the latch signals LAT1 to LATm corresponding to each of the discharge modules 23-1 to 23-$m$ output by the restoration circuit 220 may be common signals to the discharge modules 23-1 to 23-$m$.

Here, in view of the fact that the restoration circuit 220 generates the clock signals SCK1 to SCKm, the print data signals SI1 to SIm, and the latch signals LAT1 to LATm by restoring and separating the data signal DATA, the data signal DATA output by the control circuit 100 is a differential signal corresponding to the clock signals SCK1 to SCKm, the print data signals SI1 to SIm, and the latch signals LAT1 to LATm. The basic data signal dDATA on which the data signal DATA is based includes signals corresponding to each of the clock signals SCK1 to SCKm, the print data signals SI1 to SIm, and the latch signals LAT1 to LATm. That is, the basic data signal dDATA includes a signal for controlling the operation of the discharge modules 23-1 to 23-$m$ included in the liquid discharge module 20.

The discharge module 23-1 includes a drive signal selection circuit 200 and a plurality of discharge portions 600. In addition, each of the plurality of discharge portions 600 includes a piezoelectric element 60.

The drive signals COMA1, COMB1, and COMC1, the reference voltage signal VBS1, the clock signal SCK1, the print data signal SI1, and the latch signal LAT1 are input to the discharge module 23-1. The drive signals COMA1, COMB1, and COMC1, the clock signal SCK1, the print data signal SI1, and the latch signal LAT1 are input to the drive signal selection circuit 200 included in the discharge module 23-1. The drive signal selection circuit 200 generates a drive signal VOUT by selecting or not selecting each of the drive signals COMA1, COMB1, and COMC1 based on the input clock signal SCK1, the print data signal SI1, and the latch signal LAT1, and supplies the drive signal VOUT to one end of the piezoelectric element 60 included in the corresponding discharge portion 600. At this time, the reference voltage signal VBS1 is supplied to the other end of the piezoelectric element 60. The piezoelectric element 60 is driven by the potential difference between the drive signal VOUT supplied to one end and the reference voltage signal VBS1 supplied to the other end, so that ink is discharged from the corresponding discharge portion 600.

Similarly, the discharge module 23-$j$ includes the drive signal selection circuit 200 and the plurality of discharge portions 600. In addition, each of the plurality of discharge portions 600 includes a piezoelectric element 60.

The drive signals COMAj, COMBj, and COMCj, the reference voltage signal VBSj, the clock signal SCKj, the print data signal SIj, and the latch signal LATj are input to the discharge module 23-$j$. The drive signals COMAj, COMBj, and COMCj, the clock signal SCKj, the print data signal SIj, and the latch signal LATj are input to the drive signal selection circuit 200 included in the discharge module 23-$j$. The drive signal selection circuit 200 generates a drive signal VOUT by selecting or not selecting each of the drive signals COMAj, COMBj, and COMCj based on the input clock signal SCKj, the print data signal SIj, and the latch signal LATj, and supplies the drive signal VOUT to one end of the piezoelectric element 60 included in the corresponding discharge portion 600. In addition, the reference voltage signal VBSj is supplied to the other end of the piezoelectric element 60. The piezoelectric element 60 is driven by the potential difference between the drive signal VOUT supplied to one end and the reference voltage signal VBSj supplied to the other end, so that ink is discharged from the corresponding discharge portion 600.

As described above, the liquid discharge device 1 of the first embodiment controls the transport of the medium P by the transport unit 4, and also controls the discharge of ink from the liquid discharge module 20 included in the discharge unit 5, based on image data supplied from a host computer or the like (not illustrated) by the control unit 2. As a result, the liquid discharge device 1 can land a desired amount of ink at a desired position on the medium P, and forms a desired image on the medium P.

Here, the discharge modules 23-1 to 23-*m* included in the liquid discharge module 20 have the same configuration except that the input signals are different. Therefore, in the following description, when it is not necessary to distinguish the discharge modules 23-1 to 23-*m*, the discharge modules may be simply referred to as a discharge module 23. In addition, in this case, the drive signals COMA1 to COMAm input to the discharge module 23 may be referred to as a drive signal COMA, the drive signals COMB1 to COMBm may be referred to as a drive signal COMB, and the drive signals COMC1 to COMCm may be referred to as a drive signal COMC. The reference voltage signals VBS1 to VBSm may be referred to as a reference voltage signal VBS, the clock signals SCK1 to SCKm may be referred to as a clock signal SCK, the print data signals SI1 to SIm may be referred to as a print data signal SI, and the latch signals LAT1 to LATm may be referred to as a latch signal LAT.

In the liquid discharge device 1 configured as described above, the liquid discharge module 20 that discharges ink under the control of the head drive module 10 is an example of the discharge head.

1.2 Functional Configuration of Drive Signal Selection Circuit

Next, the configuration and operation of the drive signal selection circuit 200 included in the discharge module 23 will be described. In describing the configuration and operation of the drive signal selection circuit 200 included in the discharge module 23, first, an example of signal waveforms included in the drive signals COMA, COMB, and COMC input to the drive signal selection circuit 200 will be described.

Figure 3:
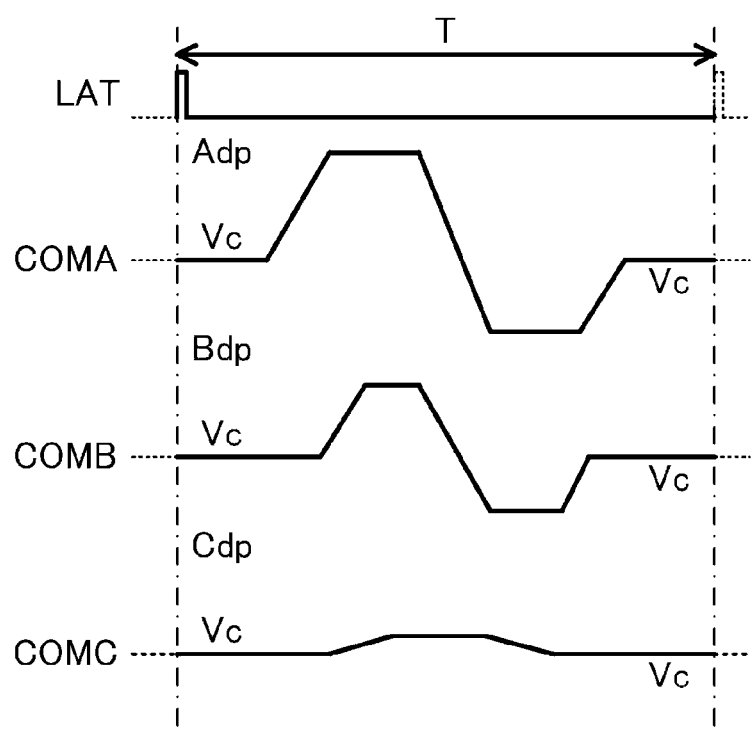
FIG. 3 is a diagram illustrating an example of signal waveforms of drive signals COMA, COMB, and COMC.

FIG. 3 is a diagram illustrating an example of the signal waveforms of the drive signals COMA, COMB, and COMC. As illustrated in FIG. 3, the drive signal COMA includes a trapezoidal waveform Adp arranged in a cycle T from the rise of the latch signal LAT to the rise of the next latch signal LAT. The trapezoidal waveform Adp is a signal waveform that is supplied to one end of the piezoelectric element 60 to discharge a predetermined amount of ink from the discharge portion 600 corresponding to the piezoelectric element 60. The drive signal COMB includes a trapezoidal waveform Bdp arranged in the cycle T. This trapezoidal waveform Bdp is a signal waveform whose voltage amplitude is smaller than that of the trapezoidal waveform Adp, and is a signal waveform that is supplied to one end of the piezoelectric element 60 to discharge a smaller amount of ink than a predetermined amount from the discharge portion 600 corresponding to the piezoelectric element 60. The drive signal COMC includes a trapezoidal waveform Cdp arranged in the cycle T. This trapezoidal waveform Cdp is a signal waveform whose voltage amplitude is smaller than that of the trapezoidal waveforms Adp and Bdp, and is a signal waveform that is supplied to one end of the piezoelectric element 60 to vibrate the ink in the vicinity of a nozzle opening portion to the extent that the ink is not discharged from the discharge portion 600 corresponding to the piezoelectric element 60. The trapezoidal waveform Cdp is supplied to the piezoelectric element 60 to vibrate the ink in the vicinity of the nozzle opening portion of the discharge portion 600 including the piezoelectric element 60. As a result, the possibility that the viscosity of the ink in the vicinity of the nozzle opening portion increases is reduced.

In addition, at the start timing and end timing of each of the trapezoidal waveforms Adp, Bdp, and Cdp, the voltage values of the trapezoidal waveforms Adp, Bdp, and Cdp are all common to the voltage Vc. That is, each of the trapezoidal waveforms Adp, Bdp, and Cdp are signal waveforms that start at the voltage Vc and end at the voltage Vc.

Here, in the following description, when the trapezoidal waveform Adp is supplied to one end of the piezoelectric element 60, the amount of ink discharged from the discharge portion 600 corresponding to the piezoelectric element 60 may be referred to as a large amount. When the trapezoidal waveform Bdp is supplied to one end of the piezoelectric element 60, the amount of ink discharged from the discharge portion 600 corresponding to the piezoelectric element 60 may be referred to as a small amount. In addition, when the trapezoidal waveform Cdp is supplied to one end of the piezoelectric element 60, vibrating the ink in the vicinity of the nozzle opening portion to the extent that the ink is not discharged from the discharge portion 600 corresponding to the piezoelectric element 60 may be referred to as microvibration.

FIG. 3 illustrates a case where each of the drive signals COMA, COMB, and COMC includes one trapezoidal waveform in the cycle T, but each of the drive signals COMA, COMB, and COMC may include two or more consecutive trapezoidal waveforms in the cycle T. In this case, a signal defining the switching timing of two or more trapezoidal waveforms is input to the drive signal selection circuit 200, and the discharge portion 600 discharges ink a plurality of times in the cycle T. The ink discharged in the plurality of times in the cycle T lands on the medium P and is bonded to form one dot on the medium P. As a result, the number of gradations of dots formed on the medium P can be increased.

On the other hand, in the liquid discharge device 1 described in the first embodiment, the drive signals COMA, COMB, and COMC are signals including one trapezoidal waveform in the cycle T, so that the cycle T for forming dots on the medium P can be shortened, and the image formation speed on the medium P can be increased. The drive signals COMA, COMB, and COMC are supplied to the liquid discharge module 20 in parallel, so that the number of gradations of dots formed on the medium P is also increased. Here, the cycle T from the rise of the latch signal LAT to the next rise of the latch signal LAT may be referred to as a dot formation cycle for forming dots of a desired size on the medium P.

The signal waveforms included in the drive signals COMA, COMB, and COMC are not limited to the signal waveforms exemplified in FIG. 3, and various signal waveforms may be used depending on the type of ink discharged from the discharge portion 600, the number of piezoelectric elements 60 driven by drive signals COMA, COMB, and COMC, the wiring length propagated by the drive signals COMA, COMB, and COMC, and the like. That is, the drive signals COMA1 to COMAm illustrated in FIGS. 2A and 2B may each include different signal waveforms, and similarly, the drive signals COMB1 to COMBm and the drive signals COMC1 to COMCm may each include different signal waveforms.

Figure 4:
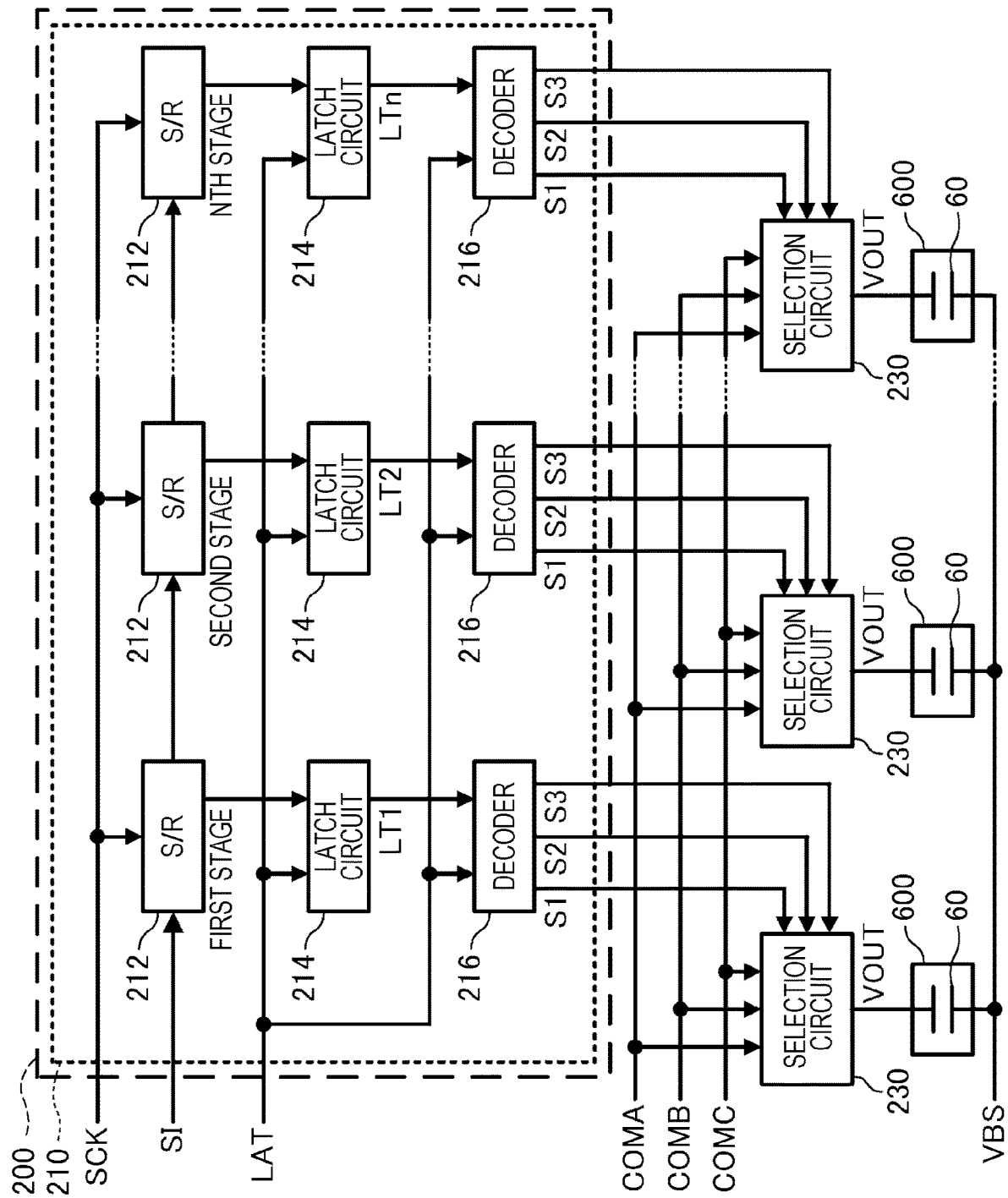
FIG. 4 is a diagram illustrating a functional configuration of a drive signal selection circuit.

Next, the configuration and operation of the drive signal selection circuit 200 that outputs the drive signal VOUT by selecting or not selecting each of the drive signals COMA, COMB, and COMC will be described. FIG. 4 is a diagram illustrating a functional configuration of the drive signal selection circuit 200. As illustrated in FIG. 4, the drive signal selection circuit 200 includes a selection control circuit 210 and a plurality of selection circuits 230.

The print data signal SI, the latch signal LAT, and the clock signal SCK are input to the selection control circuit 210. In addition, the selection control circuit 210 includes a set of a shift register (S/R) 212, a latch circuit 214, and a decoder 216 corresponding to each of the n discharge portions 600. That is, the drive signal selection circuit 200 includes n shift registers 212, n latch circuits 214, and n decoders 216, which are the same as the total number of discharge portions 600.

The print data signal SI is a signal synchronized with the clock signal SCK, and includes 2-bit print data [SIH, SIL] for defining the dot size formed by the ink discharged from each of the n discharge portions 600 by any of "large dot LD", "small dot SD", "non-discharge ND", and "microvibration BSD". This print data signal SI is held in the shift register 212 corresponding to the discharge portion 600 for each 2-bit print data [SIH, SIL].

Specifically, the n shift registers 212 corresponding to the discharge portion 600 are coupled in cascade to each other. The serially input print data signal SI is sequentially transferred to a subsequent stage of the shift register 212 coupled in cascade according to the clock signal SCK. When the supply of the clock signal SCK is stopped, the 2-bit print data [SIH, SIL] corresponding to the discharge portion 600 corresponding to the shift register 212 is held in the n shift registers 212. In FIG. 4, in order to distinguish the n shift registers 212 coupled in cascade, the shift registers are expressed as first stage, second stage, . . . , Nth stage from the upstream to the downstream where the print data signal SI is input.

Each of the n latch circuits 214 latches simultaneously the 2-bit print data [SIH, SIL] held by the corresponding shift register 212 at the rise of the latch signal LAT.

Figures 5, 6:
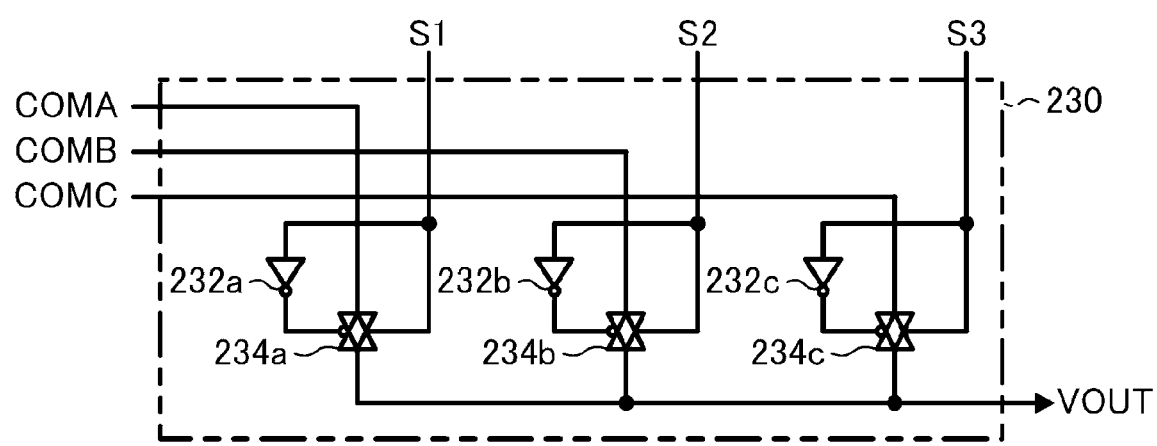
FIG. 5 is a table illustrating an example of a decoding content in a decoder.
FIG. 6 is a diagram illustrating an example of a configuration of a selection circuit corresponding to one discharge portion.

Each of the n decoders 216 decodes the 2-bit print data [SIH, SIL] latched by the corresponding latch circuit 214, and outputs the logic level selection signals S1, S2, and S3 according to a decoding content for each cycle T. FIG. 5 is a diagram illustrating an example of the decoding content in the decoder 216. The decoder 216 outputs the logic level selection signals S1, S2, and S3 defined by the latched 2-bit print data [SIH, SIL] and the decoding content illustrated in FIG. 5. For example, when the 2-bit print data [SIH, SIL] latched by the corresponding latch circuit 214 is [1,0], the decoder 216 in the first embodiment sets each of the logic levels of the selection signals S1, S2, and S3 to the L, H, and L levels in the cycle T.

The selection circuit 230 is provided corresponding to each of the n discharge portions 600. That is, the drive signal selection circuit 200 includes n selection circuits 230. The selection signals S1, S2, and S3 output by the decoder 216 corresponding to the same discharge portion 600 and the drive signals COMA, COMB, and COMC are input to the selection circuit 230. The selection circuit 230 generates a drive signal VOUT by selecting or not selecting each of the drive signals COMA, COMB, and COMC based on the selection signals S1, S2, and S3 and the drive signals COMA, COMB, and COMC, and outputs the drive signal VOUT to the corresponding discharge portion 600.

FIG. 6 is a diagram illustrating an example of a configuration of the selection circuit 230 corresponding to one discharge portion 600. As illustrated in FIG. 6, the selection circuit 230 includes inverters 232a, 232b, and 232c and transfer gates 234a, 234b, and 234c.

The selection signal S1 is input to a positive control end not marked with a circle at the transfer gate 234a, while being logically inverted by the inverter 232a and input to a negative control end marked with a circle at the transfer gate 234a. In addition, the drive signal COMA is supplied to an input terminal of the transfer gate 234a. The transfer gate 234a is conductive between the input terminal and the output terminal when the input selection signal S1 is H level, and is non-conductive between the input terminal and the output terminal when the input selection signal S1 is L level. That is, the transfer gate 234a outputs the drive signal COMA to the output terminal when the selection signal S1 is H level, and does not output the drive signal COMA to the output terminal when the selection signal S1 is L level.

The selection signal S2 is input to a positive control end not marked with a circle in the transfer gate 234b, while being logically inverted by the inverter 232b and input to a negative control end marked with a circle in the transfer gate 234b. In addition, the drive signal COMB is supplied to the input terminal of the transfer gate 234b. The transfer gate 234b is conductive between the input terminal and the output terminal when the input selection signal S2 is H level, and is non-conductive between the input terminal and the output terminal when the input selection signal S2 is L level. That is, the transfer gate 234b outputs the drive signal COMB to the output terminal when the selection signal S2 is H level, and does not output the drive signal COMB to the output terminal when the selection signal S2 is L level.

The selection signal S3 is input to a positive control end not marked with a circle in the transfer gate 234c, while being logically inverted by the inverter 232c and input to a negative control end marked with a circle in the transfer gate 234c. In addition, the drive signal COMC is supplied to the input terminal of the transfer gate 234c. The transfer gate 234c is conductive between the input terminal and the output terminal when the input selection signal S3 is H level, and is non-conductive between the input terminal and the output terminal when the input selection signal S3 is L level. That is, the transfer gate 234c outputs the drive signal COMC to the output terminal when the selection signal S3 is H level, and does not output the drive signal COMC to the output terminal when the selection signal S3 is L level.

The output terminals of the transfer gates 234a, 234b, and 234c are commonly coupled. That is, the drive signals COMA, COMB, and COMC selected or not selected by the selection signals S1, S2, and S3 are supplied to the output terminals of the transfer gates 234a, 234b, and 234c commonly coupled. The selection circuit 230 outputs the signal supplied to the output terminals commonly coupled to the corresponding discharge portion 600 as the drive signal VOUT.

Figure 7:
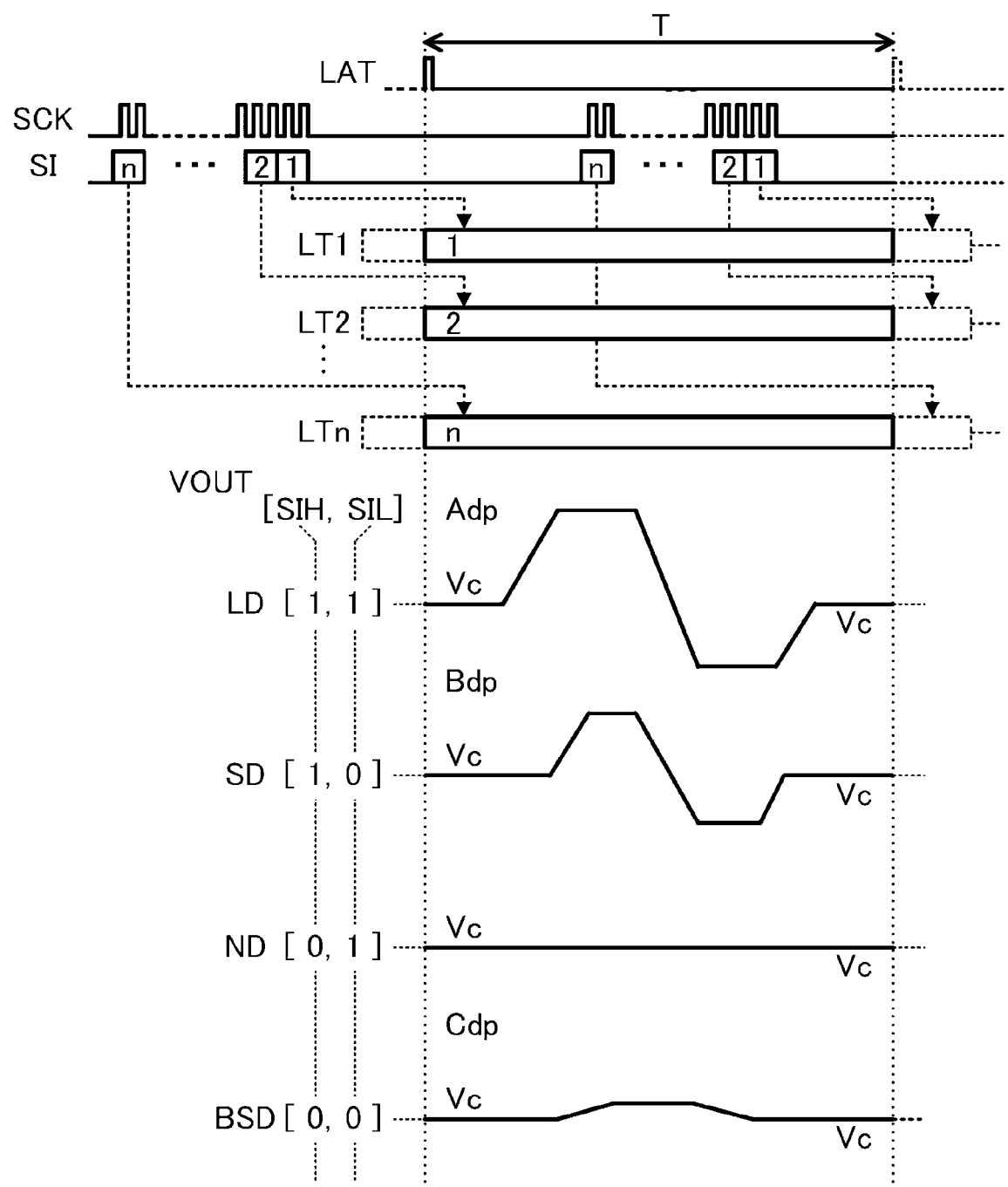
FIG. 7 is a diagram for describing an operation of the drive signal selection circuit.

An operation of the drive signal selection circuit 200 will be described. FIG. 7 is a diagram for describing the operation of the drive signal selection circuit 200. The print data signal SI is serially input in synchronization with the clock signal SCK, and is sequentially transferred by the shift register 212 corresponding to the discharge portion 600. When the input of the clock signal SCK is stopped, the 2-bit print data [SIH, SIL] corresponding to each of the discharge portions 600 is held in the corresponding shift register 212.

Thereafter, when the latch signal LAT rises, the 2-bit print data [SIH, SIL] held in the shift register 212 are simultaneously latched by the latch circuit 214. In FIG. 7, the 2-bit print data [SIH, SIL] corresponding to first stage, second stage, . . . , Nth stage shift registers 212 latched by the latch circuit 214 are illustrated as LT1, LT2, . . . , LTn.

The decoder 216 outputs the logic level selection signals S1, S2, and S3 according to the dot size defined by the latched 2-bit print data [SIH, SIL].

Specifically, when the print data [SIH, SIL] is [1,1], the decoder 216 outputs the logic levels of the selection signals S1, S2, and S3 to the selection circuit 230 as the H, L, and L levels in the cycle T. As a result, the selection circuit 230 selects the trapezoidal waveform Adp in the cycle T and outputs the drive signal VOUT corresponding to the "large dot LD". In addition, when the print data [SIH, SIL] is [1,0], the decoder 216 outputs the logic levels of the selection signals S1, S2, and S3 to the selection circuit 230 as the L, H, and L levels in the cycle T. As a result, the selection circuit 230 selects the trapezoidal waveform Bdp in the cycle T and outputs the drive signal VOUT corresponding to the "small dot SD". In addition, when the print data [SIH, SIL] is [0,1], the decoder 216 outputs the logic levels of the selection signals S1, S2, and S3 to the selection circuit 230 as the L, L, and L levels in the cycle T. As a result, the selection circuit 230 does not select any of the trapezoidal waveforms Adp, Bdp, and Cdp in the cycle T, and outputs the drive signal VOUT corresponding to a constant "non-discharge ND" at the voltage Vc. In addition, when the print data [SIH, SIL] is [0,0], the decoder 216 outputs the logic levels of the selection signals S1, S2, and S3 to the selection circuit 230 as the L, L, and H levels in the cycle T. As a result, the selection circuit 230 selects the trapezoidal waveform Cdp in the cycle T and outputs the drive signal VOUT corresponding to the "micro-vibration BSD".

Here, when the selection circuit 230 does not select any of the trapezoidal waveforms Adp, Bdp, and Cdp, the voltage Vc supplied immediately before the piezoelectric element 60 is held by the capacitance component of the piezoelectric element 60 at one end of the corresponding piezoelectric element 60. That is, the fact that the selection circuit 230 outputs a constant drive signal VOUT at the voltage Vc includes the case where the voltage Vc immediately before being held by the capacitance component of the piezoelectric element 60 is supplied to the piezoelectric element 60 as the drive signal VOUT, when none of the trapezoidal waveforms Adp, Bdp, and Cdp is selected as the drive signal VOUT.

As described above, the drive signal selection circuit 200 generates a drive signal VOUT corresponding to each of the plurality of discharge portions 600 by selecting or not selecting the drive signals COMA, COMB, and COMC based on the print data signal SI, the latch signal LAT, and the clock signal SCK, and outputs the drive signal VOUT to the corresponding discharge portion 600. As a result, the amount of ink discharged from each of the plurality of discharge portions 600 is individually controlled.

1.3 Configuration of Drive Signal Output Circuit

Figure 8:
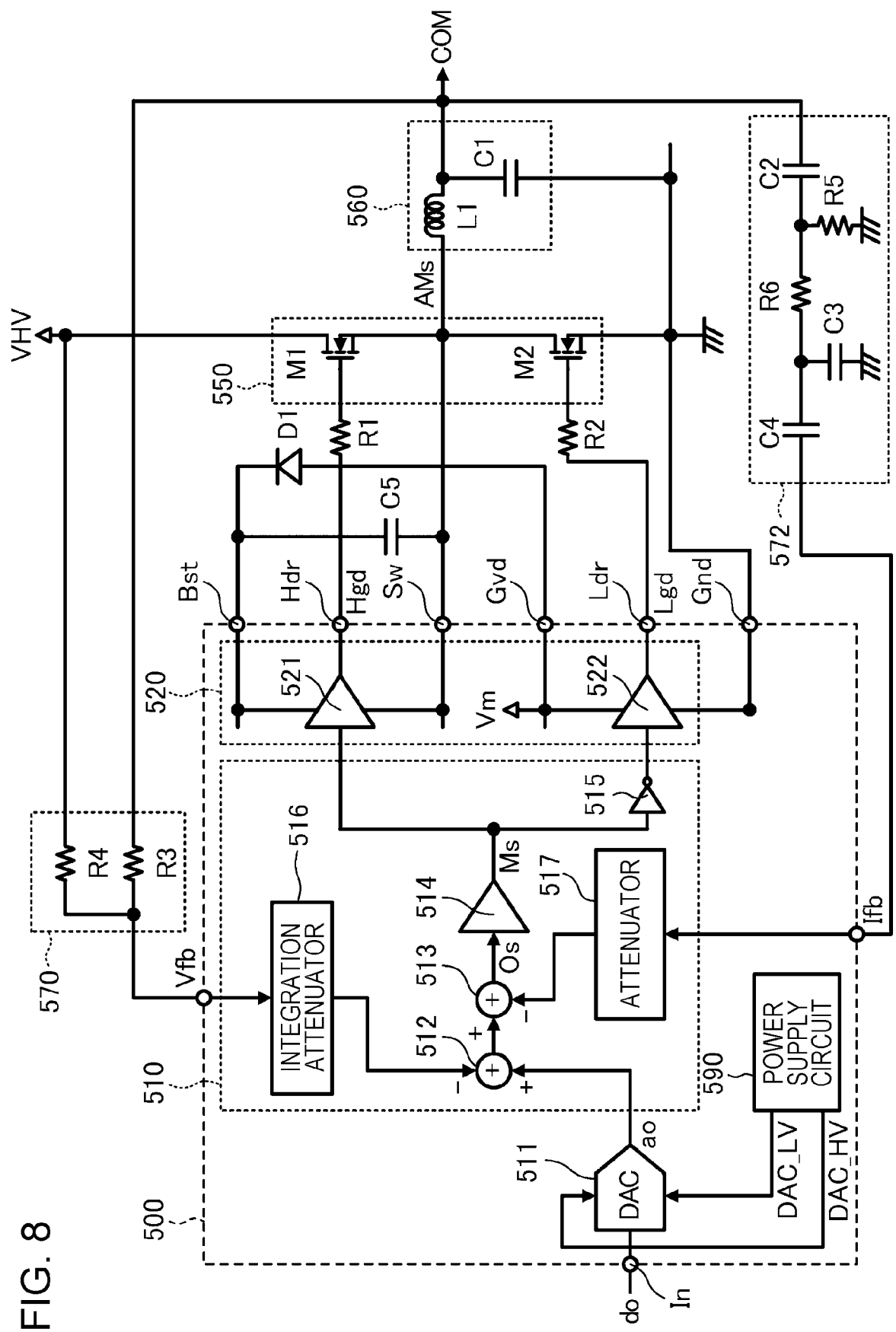
FIG. 8 is a diagram illustrating a configuration of a drive circuit.

Next, the configuration and operation of the drive circuit 52 that outputs the drive signals COMA, COMB, and COMC will be described. FIG. 8 is a diagram illustrating the configuration of the drive circuit 52. The drive circuit 52 includes an integrated circuit 500, an amplifier circuit 550, a demodulation circuit 560, feedback circuits 570 and 572, and other electronic components.

The integrated circuit 500 includes a plurality of terminals including a terminal In, a terminal Bst, a terminal Hdr, a terminal Sw, a terminal Gvd, a terminal Ldr, and a terminal Gnd. The integrated circuit 500 is electrically coupled to an externally provided substrate (not illustrated) via the plurality of terminals. The integrated circuit 500 includes a digital to analog converter (DAC) 511, a modulation circuit 510, a gate drive circuit 520, and a power supply circuit 590.

The power supply circuit 590 generates a voltage signal DAC_HV and a voltage signal DAC_LV and supplies the voltage signals to the DAC 511. The DAC 511 converts the digital basic drive signal do that defines the signal waveform of the input drive signal COM into a basic drive signal ao that is an analog signal of the voltage value between the voltage signal DAC_HV and the voltage signal DAC_LV, and outputs the basic drive signal ao to the modulation circuit 510. Here, the maximum value of the voltage amplitude of the basic drive signal ao is defined by the voltage signal DAC_HV, and the minimum value is defined by the voltage signal DAC_LV. That is, the voltage signal DAC_HV is the reference voltage on the high voltage side in the DAC 511, and the voltage signal DAC_LV is the reference voltage on the low voltage side in the DAC 511. The signal obtained by amplifying the analog basic drive signal ao output by the DAC 511 is the drive signal COM. That is, the basic drive signal ao corresponds to a target signal before amplification of the drive signal COM.

The modulation circuit 510 generates a modulation signal Ms obtained by modulating the basic drive signal ao and outputs the modulation signal Ms to the gate drive circuit 520. The modulation circuit 510 includes adders 512 and 513, a comparator 514, an inverter 515, an integration attenuator 516, and an attenuator 517.

The integration attenuator 516 attenuates and integrates the drive signal COM input via a terminal Vfb and supplies the drive signal COM to the input terminal on the − side of the adder 512. In addition, the basic drive signal ao is input to the input terminal on the + side of the adder 512. The adder 512 supplies the voltage obtained by subtracting and integrating the voltage input to the input terminal on the − side from the voltage input to the input terminal on the + side to the input terminal on the + side of the adder 513.

The attenuator 517 supplies a voltage obtained by attenuating the high frequency component of the drive signal COM input via a terminal Ifb to the input terminal on the − side of the adder 513. In addition, the voltage output from the adder 512 is input to the input terminal on the + side of the adder 513. The adder 513 outputs a voltage signal Os obtained by subtracting the voltage input to the input terminal on the − side from the voltage input to the input terminal on the + side to the comparator 514.

The comparator 514 outputs a modulation signal Ms obtained by pulse-modulating the voltage signal Os output from the adder 513. Specifically, the comparator 514 outputs the modulation signal Ms that is an H level when the voltage value of the voltage signal Os output from the adder 513 is rising and is a predetermined threshold value Vth1 or more, and that is L level when the voltage value of the voltage signal Os is falling and falls below a predetermined threshold value Vth2. The threshold values Vth1 and Vth2 are set in the relationship of threshold value Vth1=>threshold value Vth2.

The modulation signal Ms output from the comparator 514 is supplied to the gate driver 521 included in the gate drive circuit 520, and is supplied to the gate driver 522 included in the gate drive circuit 520 after the logic level is inverted by the inverter 515. That is, a modulation signal Ms having a logic level of exclusive relationship is input to the gate driver 521 and the gate driver 522. Here, strictly speaking, the logic level of exclusive relationship means that the logic levels of the signals supplied to the gate driver 521 and the gate driver 522 do not be H level at the same time, and in detail, means that a transistor M1 and a transistor M2 included in the amplifier circuit 550 described later are not turned on at the same time. Therefore, the modulation circuit 510 may include a timing control circuit for controlling the timing of the modulation signal Ms supplied to the gate driver 521 and the signal in which the logic level of the modulation signal Ms supplied to the gate driver 522 is inverted.

The gate drive circuit 520 includes the gate driver 521 and the gate driver 522. The gate driver 521 level-shifts the modulation signal Ms output from the comparator 514 and outputs the modulation signal Ms as an amplification control signal Hgd from the terminal Hdr.

Specifically, the voltage is supplied to the higher side of the power supply voltage of the gate driver 521 via the terminal Bst, and the voltage is supplied to the lower side via the terminal Sw. The terminal Bst is coupled to one end of a capacitor C5 and the cathode of the diode D1 for preventing backflow. The terminal Sw is coupled to the other end of the capacitor C5. In addition, the anode of the diode D1 is coupled to a terminal Gvd to which a voltage Vm, which is a DC voltage of, for example, 7.5 V, is supplied from a power supply circuit (not illustrated). That is, the voltage Vm, which is a DC voltage, is supplied to the anode of the diode D1. Therefore, the potential difference between the terminal Bst and the terminal Sw is approximately equal to the voltage Vm. As a result, the gate driver 521 outputs an amplification control signal Hgd having a voltage value larger by the voltage Vm with respect to the terminal Sw from the terminal Hdr according to the input modulation signal Ms.

The gate driver 522 operates on the lower potential side than the gate driver 521. The gate driver 522 level-shifts the signal in which the logic level of the modulation signal Ms output from the comparator 514 is inverted by the inverter 515, and outputs the signal as an amplification control signal Lgd from the terminal Ldr.

Specifically, the voltage Vm is supplied to the higher side of the power supply voltage of the gate driver 522, and the ground potential of, for example, 0 V is supplied to the lower side via the terminal Gnd. The gate driver 522 outputs an amplification control signal Lgd having a voltage value larger by the voltage Vm with respect to the terminal Gnd from the terminal Ldr according to the signal in which the logic level of the input modulation signal Ms is inverted.

The amplifier circuit 550 includes the transistor M1 and the transistor M2.

A voltage VHV, which is a DC voltage of, for example, 42 V, is supplied to a drain of the transistor M1 as an amplification voltage. The gate of the transistor M1 is electrically coupled to one end of a resistor R1 and the other end of the resistor R1 is electrically coupled to the terminal Hdr of the integrated circuit 500. That is, the amplification control signal Hgd is supplied to the gate of the transistor M1. The source of the transistor M1 is electrically coupled to the terminal Sw of the integrated circuit 500.

A drain of the transistor M2 is electrically coupled to the terminal Sw of the integrated circuit 500. That is, the drain of the transistor M2 and the source of the transistor M1 are electrically coupled to each other. The gate of the transistor M2 is electrically coupled to one end of the resistor R2, and the other end of the resistor R2 is electrically coupled to the terminal Ldr of the integrated circuit 500. That is, the amplification control signal Lgd is supplied to the gate of the transistor M2. A ground potential is supplied to the source of the transistor M2.

In the amplifier circuit 550 configured as described above, when the transistor M1 is controlled to be off and the transistor M2 is controlled to be on, the potential of the node to which the terminal Sw is coupled is the ground potential. Therefore, the voltage Vm is supplied to the terminal Bst. On the other hand, when the transistor M1 is controlled to be on and the transistor M2 is controlled to be off, the potential of the node to which the terminal Sw is coupled is the voltage VHV. Therefore, a voltage signal having a potential of voltage VHV+Vm is supplied to the terminal Bst. That is, using the capacitor C5 as a floating power source, the potential of the terminal Sw changes to 0V or the voltage VHV according to the operation of the transistor M1 and the transistor M2, so that the gate driver 521 that drives the transistor M1 supplies the amplification control signal Hgd of the potential where the L level is the potential of the voltage VHV and the H level is the voltage VHV+the voltage Vm to the gate of the transistor M1.

On the other hand, the gate driver 522 that drives the transistor M2 supplies the amplification control signal Lgd of the potential where the L level is the ground potential and the H level is the voltage Vm to the gate of the transistor M2 regardless of the operation of the transistor M1 and the transistor M2.

The amplifier circuit 550 configured as described above generates an amplification modulation signal AMs obtained by amplifying the modulation signal Ms based on the voltage VHV at a coupling point between the source of the transistor M1 and the drain of the transistor M2. The amplifier circuit 550 outputs the generated amplification modulation signal AMs to the demodulation circuit 560.

The demodulation circuit 560 generates a drive signal COM by demodulating the amplification modulation signal AMs output by the amplifier circuit 550, and outputs the drive signal COM from the drive circuit 52. The demodulation circuit 560 includes an inductor L1 and a capacitor C1. One end of the inductor L1 is coupled to one end of the capacitor C1. The amplification modulation signal AMs is input to the other end of the inductor L1. In addition, a ground potential is supplied to the other end of the capacitor C1. That is, in the demodulation circuit 560, the inductor L1 and the capacitor C1 form a low pass filter. The demodulation circuit 560 demodulates by smoothing the amplification modulation signal AMs output from the amplifier circuit 550 by the low pass filter, and outputs the demodulated signal as the drive signal COM.

The feedback circuit 570 includes a resistor R3 and a resistor R4. The drive signal COM is supplied to one end of the resistor R3, and the other end is coupled to the terminal Vfb and one end of the resistor R4. The voltage VHV is supplied to the other end of the resistor R4. As a result, the drive signal COM passed through the feedback circuit 570 is fed back to the terminal Vfb in a state of being pulled up by the voltage VHV.

The feedback circuit 572 includes capacitors C2, C3, and C4 and resistors R5 and R6. The drive signal COM is supplied to one end of the capacitor C2, and the other end is coupled to one end of the resistor R5 and one end of the resistor R6. The ground potential is supplied to the other end of the resistor R5. As a result, the capacitor C2 and the resistor R5 function as a high pass filter. The cutoff frequency of this high pass filter is set to, for example, approximately 9 MHz. In addition, the other end of the resistor R6 is coupled to one end of the capacitor C4 and one end of the capacitor C3. The ground potential is supplied to the other end of the capacitor C3. As a result, the resistor R6 and the capacitor C3 function as a low pass filter. The cutoff frequency of this low pass filter is set to, for example, approximately 160 MHz. That is, the feedback circuit 572 includes a high pass filter and a low pass filter, and functions as a band pass filter that passes a signal in a predetermined frequency range included in the drive signal COM.

The other end of the capacitor C4 is coupled to the terminal Ifb of the integrated circuit 500. As a result, among the high frequency components of the drive signal COM passed through the feedback circuit 572 that functions as a band pass filter, the signal in which the DC component is cut is fed back to the terminal Ifb.

The drive signal COM is a signal obtained by smoothing the amplification modulation signal AMs based on the basic drive signal do by the demodulation circuit 560. In addition, the drive signal COM is integrated and subtracted via the terminal Vfb, and then fed back to the adder 512. As a result, the drive circuit 52 self-oscillates at a frequency determined by the feedback delay and the feedback transfer function. However, the feedback path via the terminal Vfb has a large delay amount. Therefore, it may not be possible to raise the frequency of self-oscillation to such an extent that the accuracy of the drive signal COM can be sufficiently ensured only by feedback via the terminal Vfb. Therefore, as illustrated in FIG. 8, by providing a path for feeding back the high frequency component of the drive signal COM via the terminal Ifb separately from the path via the terminal Vfb, the delay in the entire circuit is reduced. As a result, the frequency of the voltage signal Os can be increased to such an extent that the accuracy of the drive signal COM can be sufficiently ensured as compared with the case where the path via the terminal Ifb does not exist.

As described above, the drive circuit 52 generates a drive signal COM by performing digital/analog conversion of the input basic drive signal do and then amplifying the analog signal in class D, and outputs the generated drive signal COM.

1.4 Configuration of Liquid Discharge Module

Figure 9:
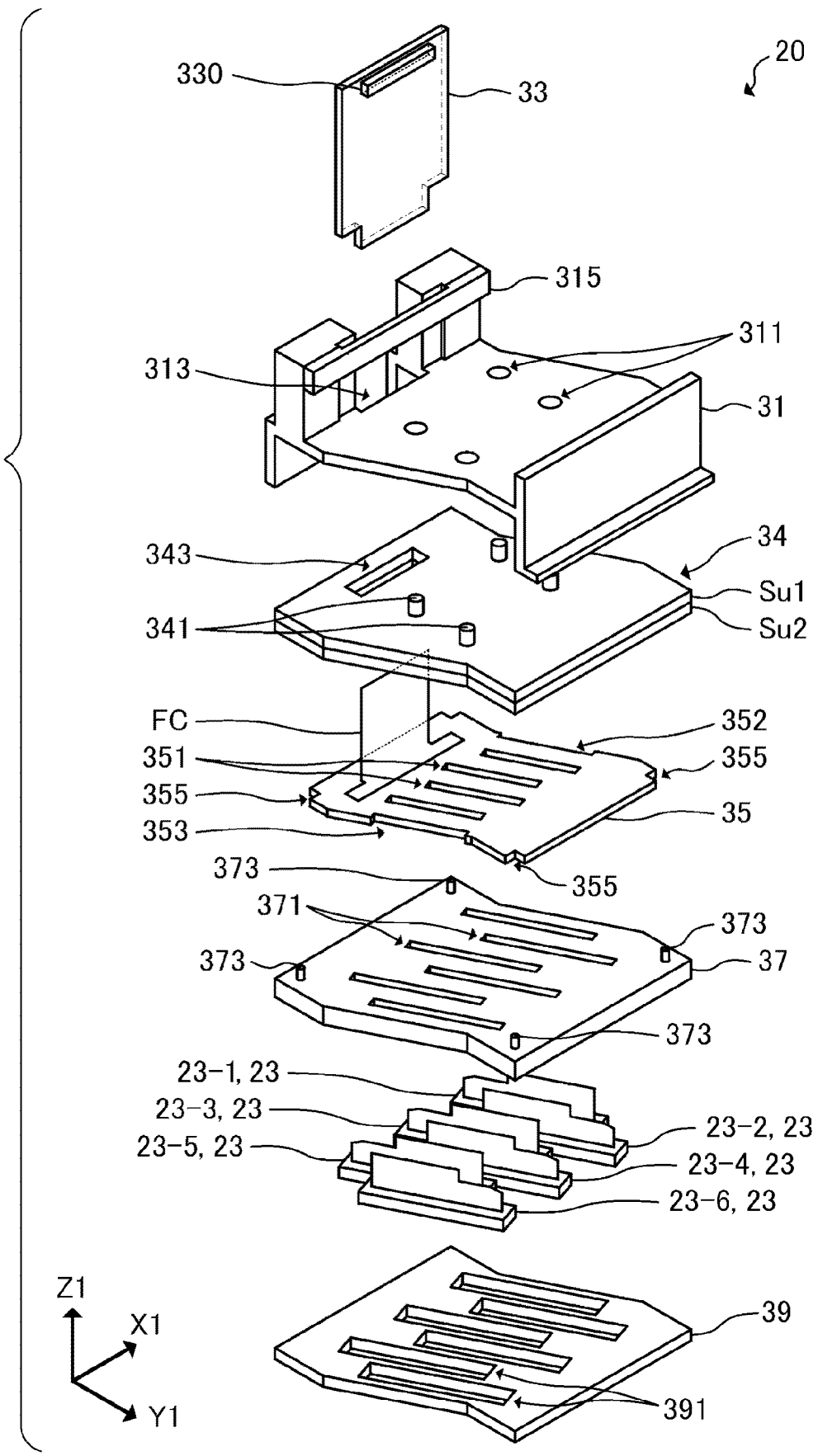
FIG. 9 is a diagram illustrating a structure of a liquid discharge module.
Figure 10:
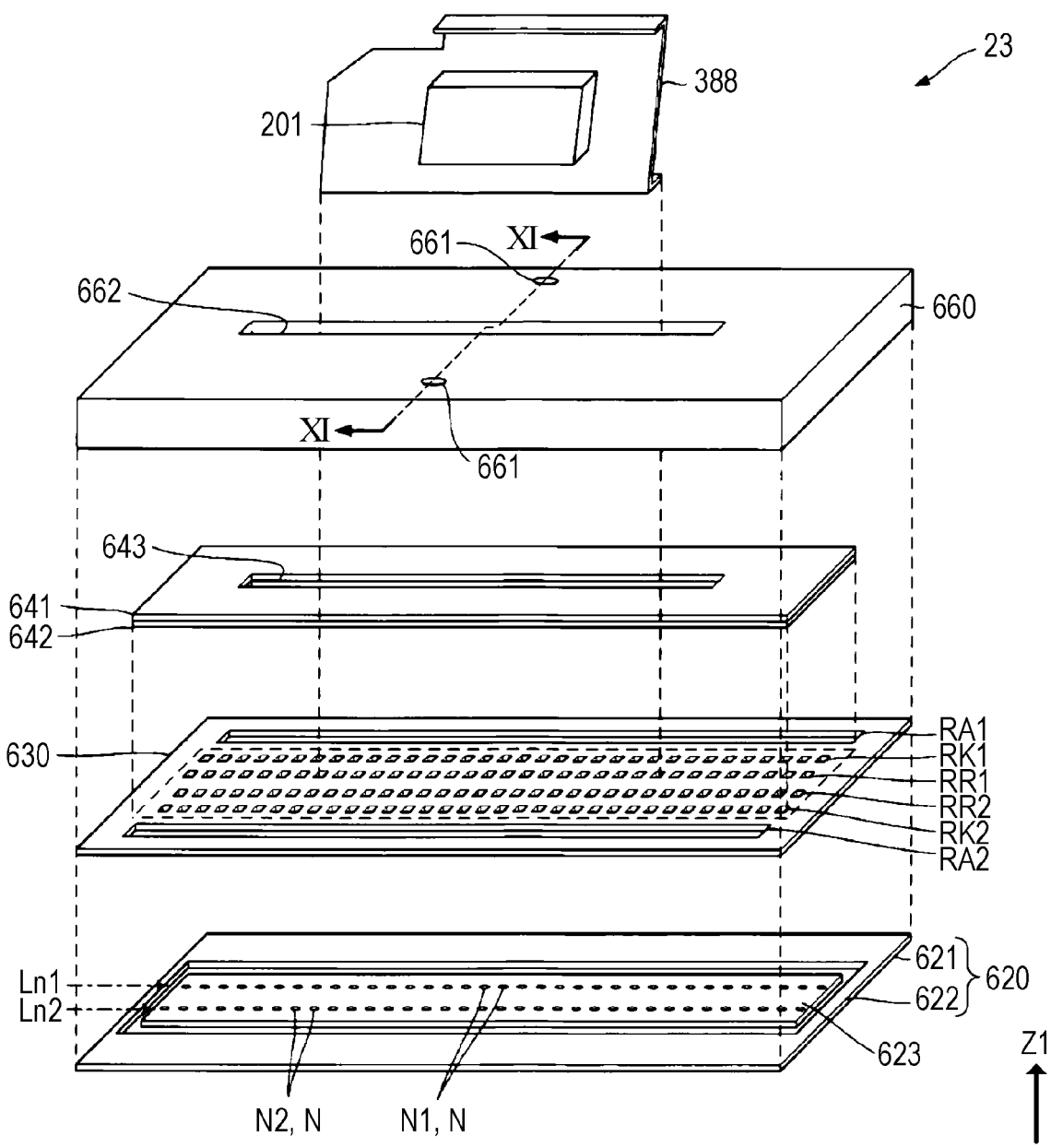
FIG. 10 is a diagram illustrating an example of a structure of a discharge module.
Figure 11:
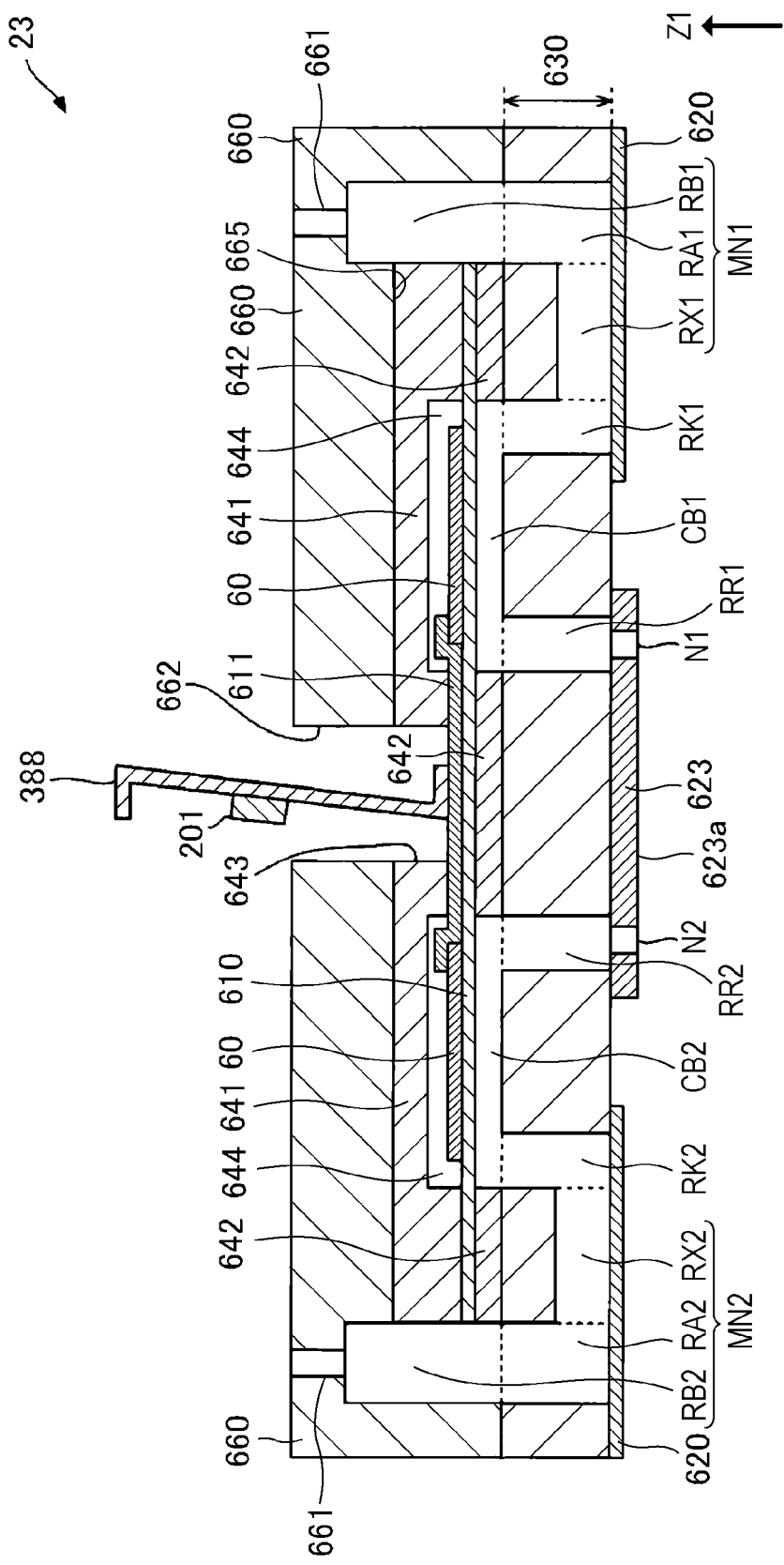
FIG. 11 is a diagram illustrating an example of a cross section of the discharge module.

Next, the structure of the liquid discharge module 20 will be described. FIG. 9 is a diagram illustrating the structure of the liquid discharge module 20. FIGS. 9 to 11 illustrate arrows indicating the X1 direction, the Y1 direction, and the Z1 direction orthogonal to each other. In addition, in the description of FIGS. 9 to 11, the starting point side of the arrow indicating the X1 direction may be referred to as a −X1 side, the tip end side may be referred to as a +X1 side, the starting point side of the arrow indicating the Y1 direction may be referred to as a −Y1 side, the tip end side may be referred to as a +Y1 side, the starting point side of the arrow indicating the Z1 direction may be referred to as a −Z1 side, and the tip end side may be referred to as a +Z1 side. Here, in the following description, in the liquid discharge device 1 according to the first embodiment, the liquid discharge module 20 will be described as having six discharge modules 23. When it is necessary to distinguish between the six discharge modules 23, the discharge modules may be referred to as discharge modules 23-1 to 23-6.

The liquid discharge module 20 includes a housing 31, an aggregate substrate 33, a flow path structure 34, a head substrate 35, a distribution flow path 37, a fixing plate 39, and discharge modules 23-1 to 23-6. In the liquid discharge module 20, the flow path structure 34, the head substrate 35, the distribution flow path 37, and the fixing plate 39 are laminated in the order of the fixing plate 39, the distribution flow path 37, the head substrate 35, and the flow path structure 34 from the −Z1 side to the +Z1 side along the Z1 direction. The housing 31 is located around the flow path structure 34, the head substrate 35, the distribution flow path 37, and the fixing plate 39 so as to support the flow path structure 34, the head substrate 35, the distribution flow path 37, and the fixing plate 39. The aggregate substrate 33 is erected on the +Z1 side of the housing 31 while being held by the housing 31, and the six discharge modules 23 are located between the distribution flow path 37 and the fixing plate 39 so that a part of the six discharge modules 23 is exposed to the outside of the liquid discharge module 20.

In describing the structure of the liquid discharge module 20, first, the structure of the discharge module 23 included in the liquid discharge module 20 will be described. FIG. 10 is a diagram illustrating an example of the structure of the discharge module 23. In addition, FIG. 11 is a diagram illustrating an example of a cross section of the discharge module 23. Here, FIG. 11 is a cross-sectional view of the discharge module 23 illustrated in FIG. 10 when the discharge module 23 is cut along the line XI-XI illustrated in FIG. 10, and the line XI-XI illustrated in FIG. 10 is a virtual line segment that passes through an introduction path 661 of the discharge module 23 and passes through a nozzle N1 and a nozzle N2.

As illustrated in FIGS. 10 and 11, the discharge module 23 includes a plurality of nozzles N1 arranged side by side and a plurality of nozzles N2 arranged side by side. The total number of nozzles N1 and nozzles N2 included in the discharge module 23 is n, which is the same as the number of discharge portions 600 included in the discharge module 23. In the first embodiment, the number of nozzles N1 and the number of nozzles N2 included in the discharge module 23 will be described as being the same. That is, the discharge module 23 will be described as having n/2 nozzles N1 and n/2 nozzles N2. Here, when it is not necessary to distinguish between the nozzle N1 and the nozzle N2 in the following description, the nozzles may be simply referred to as a nozzle N.

The discharge module 23 includes a wiring member 388, a case 660, a protective substrate 641, a flow path formation substrate 642, a communication plate 630, a compliance substrate 620, and a nozzle plate 623.

On the flow path formation substrate 642, pressure chambers CB1 partitioned by a plurality of partition walls by anisotropic etching from one surface side are arranged side by side corresponding to the nozzle N1, and pressure chambers CB2 partitioned by a plurality of partition walls by anisotropic etching from one surface side are arranged side by side corresponding to the nozzle N2. Here, in the following description, when it is not necessary to distinguish between the pressure chamber CB1 and the pressure chamber CB2, the pressure chambers may be simply referred to as a pressure chamber CB.

The nozzle plate 623 is located on the −Z1 side of the flow path formation substrate 642. The nozzle plate 623 is provided with a nozzle row Ln1 formed by n/2 nozzles N1 and a nozzle row Ln2 formed by n/2 nozzles N2. Here, in the following description, the surface of the nozzle plate 623 on which the nozzle N opens on the −Z1 side may be referred to as a liquid ejection surface 623a.

The communication plate 630 is located on the −Z1 side of the flow path formation substrate 642 and on the +Z1 side of the nozzle plate 623. The communication plate 630 is provided with a nozzle communication path RR1 that communicates with the pressure chamber CB1 and the nozzle N1, and a nozzle communication path RR2 that communicates with the pressure chamber CB2 and the nozzle N2. In addition, the communication plate 630 is provided with a pressure chamber communication path RK1 for communicating the end portion of the pressure chamber CB1 and a manifold MN1 and a pressure chamber communication path RK2 for communicating the end portion of the pressure chamber CB2 and a manifold MN2 independently corresponding to each of the pressure chambers CB1 and CB2.

The manifold MN1 includes a supply communication path RA1 and a coupling communication path RX1. The supply communication path RA1 is provided so as to penetrate the communication plate 630 along the Z1 direction, and is provided halfway in the Z1 direction by opening the coupling communication path RX1 toward the nozzle plate 623 of the communication plate 630 without penetrating the communication plate 630 in the Z1 direction. Similarly, the manifold MN2 includes a supply communication path RA2 and a coupling communication path RX2. The supply communication path RA2 is provided so as to penetrate the communication plate 630 along the Z1 direction, and is provided halfway in the Z1 direction by opening the coupling communication path RX2 toward the nozzle plate 623 of the communication plate 630 without penetrating the communication plate 630 in the Z1 direction. The coupling communication path RX1 included in the manifold MN1 communicates with the corresponding pressure chamber CB1 by the pressure chamber communication path RK1, and the coupling communication path RX2 included in the manifold MN2 communicates with the corresponding pressure chamber CB2 by the pressure chamber communication path RK2.

Here, in the following description, when it is not necessary to distinguish between the nozzle communication path RR1 and the nozzle communication path RR2, the nozzle communication paths may be simply referred to as a nozzle communication path RR, and it is not necessary to distinguish between the manifold MN1 and the manifold MN2, the manifolds may be simply referred to as a manifold MN. When it is not necessary to distinguish between the supply communication path RA1 and the supply communication path RA2, the supply communication paths may be simply referred to as a supply communication path RA, and when it is not necessary to distinguish between the coupling communication path RX1 and the coupling communication path RX2, the coupling communication paths may be simply referred to as a coupling communication path RX.

A diaphragm 610 is located on the surface of the flow path formation substrate 642 on the +Z1 side. In addition, the piezoelectric elements 60 are formed in two rows corresponding to the nozzles N1 and N2 on the surface of the diaphragm 610 on the +Z1 side. One electrode of the piezoelectric element 60 and the piezoelectric layer are formed for each pressure chamber CB, and the other electrode of the piezoelectric element 60 is configured as a common electrode common to the pressure chamber CB. The drive signal VOUT is supplied from the drive signal selection circuit 200 to one electrode of the piezoelectric element 60, and the reference voltage signal VBS is supplied to the common electrode which is the other electrode of the piezoelectric element 60.

The protective substrate 641 is bonded to the surface of the flow path formation substrate 642 on the +Z1 side. The protective substrate 641 forms a protective space 644 for protecting the piezoelectric element 60. In addition, the protective substrate 641 is provided with a through-hole 643 penetrating along the Z1 direction. The end portion of a lead electrode 611 drawn from the electrode of the piezoelectric element 60 is extended so as to be exposed inside the through-hole 643. The wiring member 388 is electrically coupled to the end portion of the lead electrode 611 exposed inside the through-hole 643.

In addition, a case 660 that defines a part of the manifold MN communicating with a plurality of pressure chambers CB is fixed to the protective substrate 641 and the communication plate 630. The case 660 is bonded to the protective substrate 641 and also to the communication plate 630. Specifically, the case 660 includes a recessed portion 665 in which the flow path formation substrate 642 and the protective substrate 641 are accommodated on the surface on the −Z1 side. The recessed portion 665 has a wider opening area than that of the surface on which the protective substrate 641 is bonded to the flow path formation substrate 642. The opening surface of the recessed portion 665 on the −Z1 side is sealed by the communication plate 630 in a state where the flow path formation substrate 642 and the like are accommodated in the recessed portion 665. As a result, a supply communication path RB1 and a supply communication path RB2 are defined by the case 660, the flow path formation substrate 642, and the protective substrate 641 on an outer peripheral portion of the flow path formation substrate 642. Here, when it is not necessary to distinguish between the supply communication path RB1 and the supply communication path RB2, the supply communication paths may be simply referred to as a supply communication path RB.

In addition, a compliance substrate 620 is provided on the surface of the communication plate 630 where the supply communication path RA and the coupling communication path RX are opened. The compliance substrate 620 seals the openings of the supply communication path RA and the coupling communication path RX. Such a compliance substrate 620 includes a sealing film 621 and a fixed substrate 622. The sealing film 621 is formed of a flexible thin film or the like, and the fixed substrate 622 is formed of a hard material such as a metal such as stainless steel.

The case 660 is provided with an introduction path 661 for supplying ink to the manifold MN. In addition, the case 660 is an opening that communicates with the through-hole 643 of the protective substrate 641 and penetrates along the Z1 direction, and is provided with a coupling port 662 through which the wiring member 388 is inserted.

The wiring member 388 is a flexible substrate for electrically coupling the discharge module 23 and the head substrate 35, and for example, an FPC can be used. In addition, an integrated circuit 201 is mounted on the wiring member 388 by chip on film (COF). At least a part of the drive signal selection circuit 200 described above is mounted on the integrated circuit 201.

In the discharge module 23 configured as described above, the drive signal VOUT output by the drive signal selection circuit 200 and the reference voltage signal VBS are supplied to the piezoelectric element 60 via the wiring member 388. The piezoelectric element 60 is driven by a change in the potential difference between the drive signal VOUT and the reference voltage signal VBS. With the driving of the piezoelectric element 60, the diaphragm 610 is displaced in the vertical direction, and the internal pressure of the pressure chamber CB changes. Due to the change in the internal pressure of the pressure chamber CB, the ink stored inside the pressure chamber CB is discharged from the corresponding nozzle N. Here, in the discharge module 23, the configuration including the nozzle N, the nozzle communication path RR, the pressure chamber CB, the piezoelectric element 60, and the diaphragm 610 corresponds to the discharge portion 600 described above.

Returning to FIG. 9, the fixing plate 39 is located on the −Z1 side of the discharge module 23. The fixing plate 39 fixes the six discharge modules 23. Specifically, the fixing plate 39 includes six opening portions 391 penetrating the fixing plate 39 along the Z2 direction. The liquid ejection surface 623a of the discharge module 23 is exposed from each of the six opening portions 391. That is, the six discharge modules 23 are fixed to the fixing plate 39 so that the liquid ejection surface 623a is exposed from each of the corresponding opening portions 391.

The distribution flow path 37 is located on the +Z1 side of the discharge module 23. Four introduction portions 373 are provided on the surface of the distribution flow path 37 on the +Z1 side. The four introduction portions 373 are flow path tubes that protrude from the surface of the distribution flow path 37 on the +Z1 side toward the +Z1 side along the Z1 direction, and communicate with a flow path hole (not illustrated) formed on the surface of the flow path structure 34 on the −Z1 side. In addition, a flow path tube (not illustrated) that communicates with the four introduction portions 373 is located on the surface of the distribution flow path 37 on the −Z1 side. The flow path tube (not illustrated) located on the surface of the distribution flow path 37 on the −Z1 side communicates with the introduction path 661 included in each of the six discharge modules 23. In addition, the distribution flow path 37 includes six opening portions 371 penetrating along the Z1 direction. The wiring member 388 included in each of the six discharge modules 23 is inserted into the six opening portions 371.

The head substrate 35 is located on the +Z1 side of the distribution flow path 37. A wiring member FC electrically coupled to the aggregate substrate 33 described later is attached to the head substrate 35. In addition, the head substrate 35 is formed with four opening portions 351 and cutout portions 352 and 353. The wiring member 388 included in the discharge modules 23-2 to 23-5 is inserted into the four opening portions 351. The wiring member 388 of each of the discharge modules 23-2 to 23-5 through which the four opening portions 351 are inserted is electrically coupled to the head substrate 35 by solder or the like. In addition, the wiring member 388 included in the discharge module 23-1 passes through the cutout portion 352, and the wiring member 388 included in the discharge module 23-6 passes through the cutout portion 353. The wiring member 388 included in each of the discharge modules 23-1 and 23-6 that have passed through each of the cutout portions 352 and 353 is electrically coupled to the head substrate 35 by solder or the like.

In addition, four cutout portions 355 are formed at the four corners of the head substrate 35. The introduction portion 373 passes through the four cutout portions 355. The four introduction portions 373 that have passed through the cutout portion 355 are coupled to the flow path structure 34 located on the +Z1 side of the head substrate 35.

The flow path structure 34 includes a flow path plate Su1 and a flow path plate Su2. The flow path plate Su1 and the flow path plate Su2 are laminated along the Z1 direction in a state where the flow path plate Su1 is located on the +Z1 side and the flow path plate Su2 is located on the −Z1 side, and are bonded to each other by an adhesive or the like.

The flow path structure 34 includes four introduction portions 341 protruding toward the +Z1 side along the Z1 direction on the surface on the +Z1 side. The four introduction portions 341 communicate with the flow path hole (not illustrated) formed on the surface of the flow path structure 34 on the −Z1 side via the ink flow path formed inside the flow path structure 34. The flow path hole (not illustrated) formed on the surface of the flow path structure 34 on the −Z1 side and the four introduction portions 373 communicate with each other. In addition, the flow path structure 34 is formed with a through-hole 343 penetrating along the Z1 direction. The wiring member FC that is electrically coupled to the head substrate 35 is inserted into the through-hole 343. In addition, inside the flow path structure 34, in addition to the ink flow path that communicates with the introduction portion 341 and the flow path hole (not illustrated) formed on the surface on the −Z1 side, a filter or the like for capturing foreign matter contained in the ink flowing through the ink flow path may be provided.

The housing 31 is located so as to cover the periphery of the flow path structure 34, the head substrate 35, the distribution flow path 37, and the fixing plate 39, and supports the flow path structure 34, the head substrate 35, the distribution flow path 37, and the fixing plate 39. The housing 31 includes four opening portions 311, an aggregate substrate insertion portion 313, and holding members 315 and 317.

The four introduction portions 341 included in the flow path structure 34 are inserted into the four opening portions 311. Ink is supplied from the liquid container 3 to the four introduction portions 341 through which the four opening portions 311 are inserted through a tube (not illustrated) or the like.

The holding members 315 and 317 interpose the aggregate substrate 33 in a state where a part of the aggregate substrate 33 is inserted through the aggregate substrate insertion portion 313. The aggregate substrate 33 is provided with a coupling portion 330. Various signals such as a data signal DATA, drive signals COMA, COMB, and COMC, a reference voltage signal VBS, and other power supply voltages output by the head drive module 10 are input to the coupling portion 330. In addition, the wiring member FC included in the head substrate 35 is electrically coupled to the aggregate substrate 33. As a result, the aggregate substrate 33 and the head substrate 35 are electrically coupled to each other. The aggregate substrate 33 may be provided with a semiconductor device including the above-described restoration circuit 220.

In the liquid discharge module 20 configured as described above, the liquid container 3 and the introduction portion 341 communicate with each other via a tube or the like (not illustrated) to supply the ink stored in the liquid container 3. The ink supplied to the liquid discharge module 20 is guided to a flow path hole (not illustrated) formed on the surface of the flow path structure 34 on the −Z1 side via the ink flow path formed inside the flow path structure 34, and then is supplied to the four introduction portions 373 included in the distribution flow path 37. The ink supplied to the distribution flow path 37 via the four introduction portions 373 is distributed correspondingly to each of the six discharge modules 23 in an ink flow path (not illustrated) formed inside the distribution flow path 37, and then supplied to the introduction path 661 included in the corresponding discharge module 23. The ink supplied to the discharge module 23 via the introduction path 661 is stored in the pressure chamber CB included in the discharge portion 600.

In addition, the head drive module 10 and the liquid discharge module 20 are electrically coupled to each other by the wiring member 30 described above. As a result, various signals including the drive signals COMA, COMB, and COMC, the reference voltage signal VBS, and the data signal DATA output by the head drive module 10 are supplied to the liquid discharge module 20. Various signals including the drive signals COMA, COMB, and COMC, the reference voltage signal VBS, and the data signal DATA input to the liquid discharge module 20 propagate through the aggregate substrate 33 and the head substrate 35. At this time, the restoration circuit 220 generates clock signals SCK1 to SCK6, print data signals SI1 to SI6, and latch signals LAT1 to LAT6 corresponding to each of the discharge modules 23-1 to 23-6 from the data signal DATA. The integrated circuit 201 including the drive signal selection circuit 200 provided in the wiring member 388 generates drive signals VOUT corresponding to each of n and the discharge portion 600, and supplies the drive signals VOUT to the piezoelectric element 60 included in the corresponding discharge portion 600. As a result, the piezoelectric element 60 is driven, and the ink stored in the pressure chamber CB is discharged.

1.5 Structure of Drive Circuit Substrate

Figure 12:
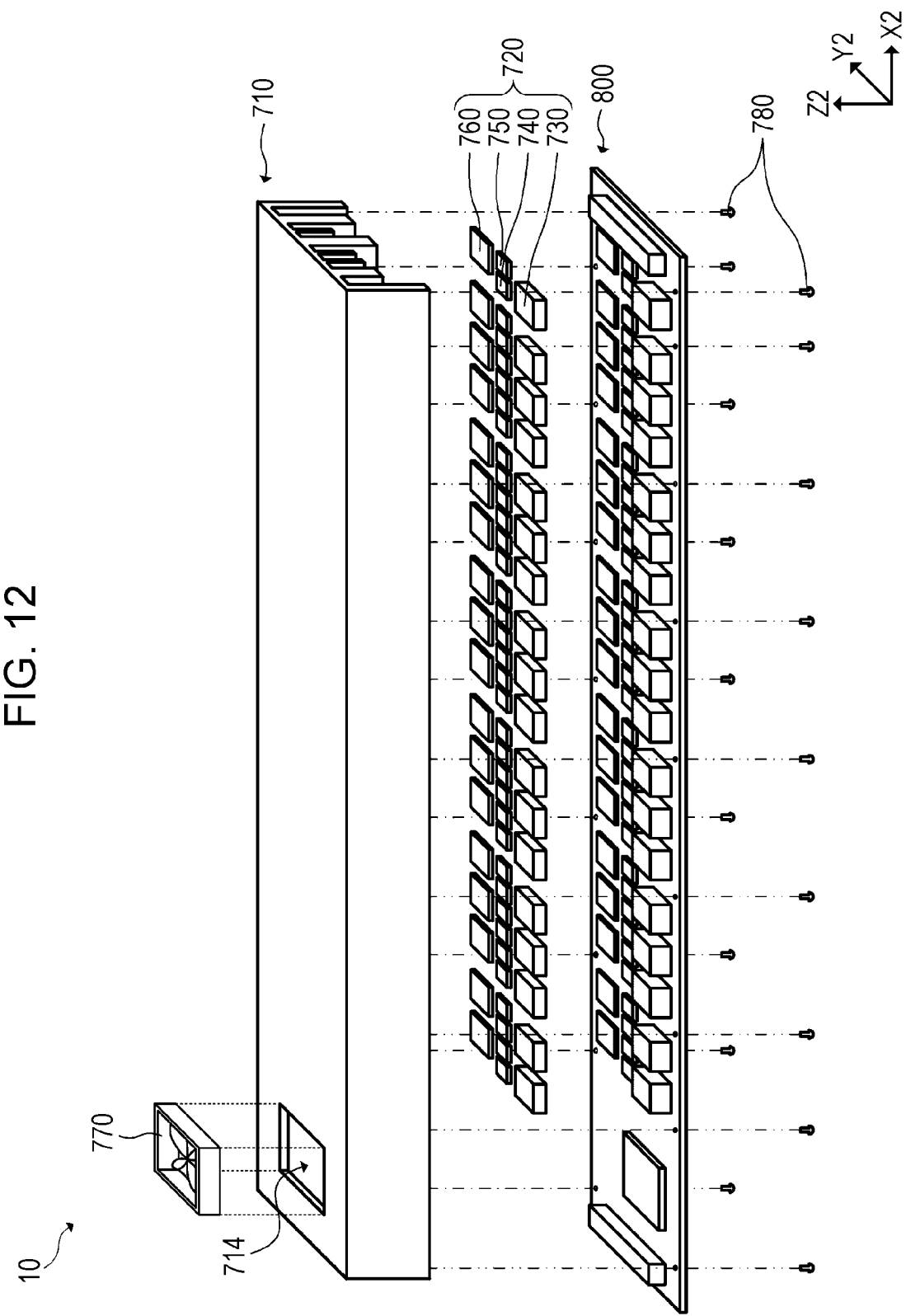
FIG. 12 is a diagram illustrating an example of a structure of a head drive module.

Next, the structure of the head drive module 10 will be described. FIG. 12 is a diagram illustrating an example of the structure of the head drive module 10. As illustrated in FIG. 12, the head drive module 10 includes a drive circuit substrate 800 including a plurality of drive circuits 52, a heat sink 710, a heat conductive member group 720, a plurality of screws 780, and a cooling fan 770.

Figure 13:
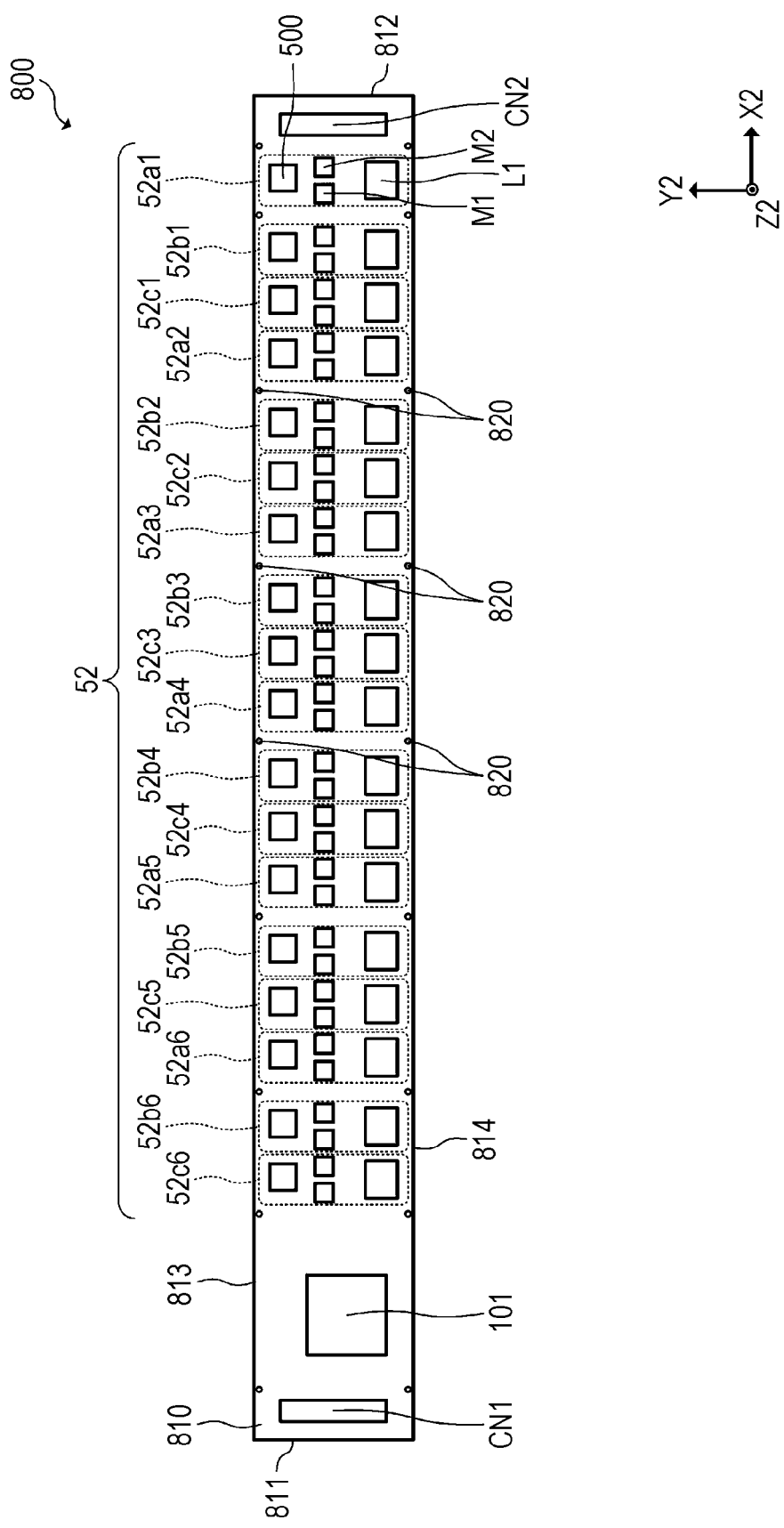
FIG. 13 is a diagram illustrating an example of a structure of a drive circuit substrate.
Figure 14:
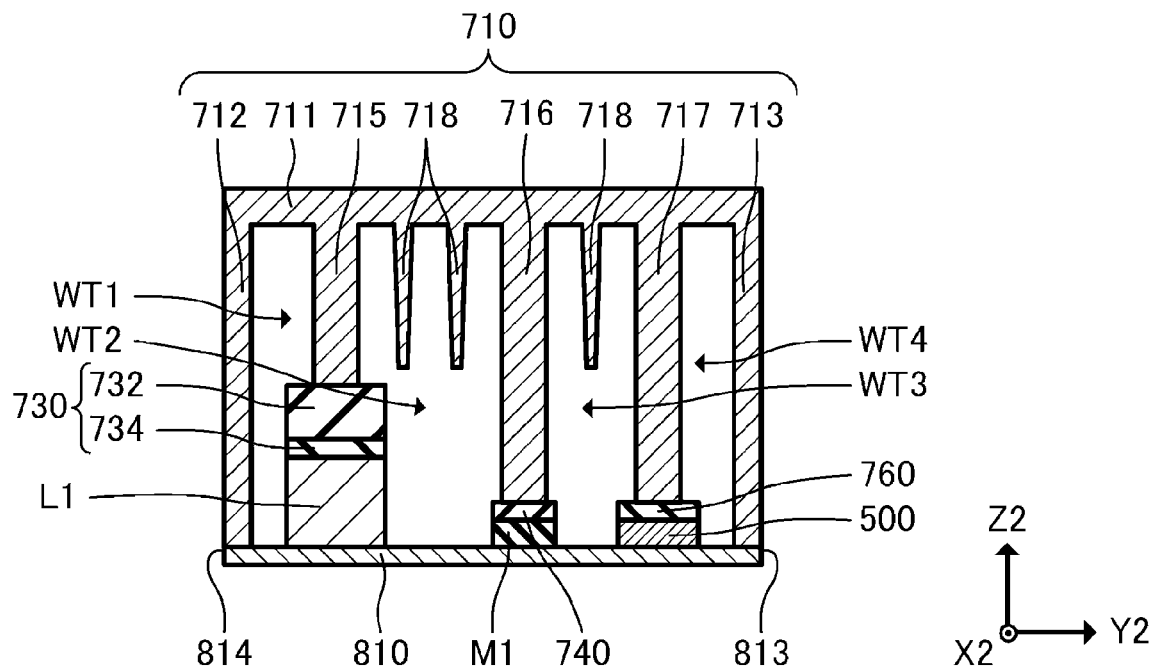
FIG. 14 is a diagram illustrating an example of a cross section of the head drive module.

Here, FIGS. 12 to 14 illustrate arrows indicating the X2 direction, the Y2 direction, and the Z2 direction which are independent of the above-described X1 direction, Y1 direction, and Z1 direction and are orthogonal to each other. In addition, in the description of FIGS. 12 to 14, the starting point side of the arrow indicating the X2 direction may be referred to as a −X2 side, the tip end side may be referred to as a +X2 side, the starting point side of the arrow indicating the Y2 direction may be referred to as a −Y2 side, the tip end side may be referred to as a +Y2 side, the starting point side of the arrow indicating the Z2 direction may be referred to as a −Z2 side, and the tip end side may be referred to as a +Z2 side.

First, an example of the structure of the drive circuit substrate 800 will be described. FIG. 13 is a diagram illustrating an example of the structure of the drive circuit substrate 800. As illustrated in FIG. 13, the drive circuit substrate 800 includes a wiring substrate 810, drive circuits 52a1 to 52a6, 52b1 to 52b6, 52c1 to 52c6 as a plurality of drive circuits 52, coupling portions CN1 and CM2, and an integrated circuit 101.

The wiring substrate 810 has a substantially shape including sides 811 and 812 facing each other along the X2 direction and sides 813 and 814 facing each other along the Y2 direction. Specifically, the side 811 is located on the −X2 side of the wiring substrate 810, and the side 812 is located on the +X2 side of the wiring substrate 810. The side 813 intersects the sides 811 and 812 and is located on the +Y2 side of the wiring substrate 810. The side 814 intersects the sides 811 and 812 and is located on the −Y2 side of the wiring substrate 810. In addition, a plurality of through-holes 820 are formed in the wiring substrate 810. Some of the plurality of through-holes 820 are arranged side by side along the side 813 of the wiring substrate 810, and some of the different through-holes 820 are arranged side by side along the side 814 of the wiring substrate 810. That is, the plurality of through-holes 820 are formed in two rows along the X2 direction on the wiring substrate 810.

The coupling portion CN1 is located along the side 811 of the wiring substrate 810. A cable (not illustrated) electrically coupled to the control unit 2 is attached to the coupling portion CN1. As a result, a signal including the image information signal IP output by the control unit 2 is supplied to the head drive module 10. The coupling portion CN1 may be a board to board (B to B) connector that enables electrical coupling between the head drive module 10 and the control unit 2 without using a cable.

The coupling portion CN2 is located along the side 812 of the wiring substrate 810. One end of the wiring member 30 is attached to the coupling portion CN2. In addition, the other end of the wiring member 30 is coupled to the coupling portion 330 included in the liquid discharge module 20. That is, the signals including the drive signals COMM to COMA6, COMB1 to COMB6, and COMC1 to COMC6 and the data signal DATA output by the head drive module 10 are supplied to the liquid discharge module 20 via the coupling portion CN2, the wiring member 30, and the coupling portion 330. The coupling portions CN2 and 330 may be B to B connectors that can be electrically coupled to each other without using the wiring member 30.

The integrated circuit 101 is located on the +X2 side of the coupling portion CN1. The integrated circuit 101 constitutes a part or all of the control circuit 100, and outputs various signals based on the image information signal IP input via the coupling portion CN1. In addition, the integrated circuit 101 may include a part or all of the conversion circuit 120 in addition to the control circuit 100. In the following description, it will be described assuming that the integrated circuit 101 includes the entire control circuit 100 and the entire conversion circuit 120, but the present disclosure is not limited thereto.

The plurality of drive circuits 52 are located side by side in the X2 direction between the integrated circuit 101 and the coupling portion CN2.

Specifically, the drive circuits 52a1 to 52a6, 52b1 to 52b6, 52c1 to 52c6 as the plurality of drive circuits 52 are located side by side between the integrated circuit 101 and the coupling portion CN2 from the side 811 to the side 812 in the order of the drive circuits 52c6, 52b6, 52a6, 52c5, 52b5, 52a5, 52c4, 52b4, 52a4, 52c3, 52b3, 52a3, 52c2, 52b2, 52a2, 52c1, 52b1, 52a1.

In addition, in this case, the transistor M1 and the transistor M2 included in each of the plurality of drive circuits 52 are arranged side by side so that the transistor M1 is on the −X2 side and the transistor M2 is on the +X2 side along the X2 direction. The inductor L1 is located on the −Y2 side of the transistors M1 and M2 arranged side by side, and the integrated circuit 500 is located on the −Y2 side of the transistors M1 and M2 arranged side by side. That is, the integrated circuit 500, the transistors M1 and M2 arranged side by side, and the inductor L1 included in each of the plurality of drive circuits 52 are located side by side on the wiring substrate 810 from the side 813 to the side 814 in the order of the integrated circuit 500, the transistors M1 and M2 located side by side, and the inductor L1.

In addition, the integrated circuits 500 included in each of the plurality of drive circuits 52 are located side by side along the X2 direction, the transistors M1 and M2 located side by side are located side by side along the X2 direction, and the inductors L1 are located side by side along the X2 direction. That is, the integrated circuits 500 are mounted side by side from the side 811 to the side 812, the transistors M1 and M2 are mounted side by side from the side 811 to the side 812, and the inductor L1 is mounted side by side from the side 811 to the side 812 on the wiring substrate 810.

In the drive circuit substrate 800 configured as described above, the image information signal IP input via the coupling portion CN1 is supplied to the integrated circuit 101.

The control circuit 100 and the conversion circuit 120 including the integrated circuit 101 generate the basic drive signals dA1 to dA6, dB1 to dB6, dC1 to dC6, and the data signal DATA based on the image information signal IP. The basic drive signals dA1 to dA6, dB1 to dB6, and dC1 to dC6 propagate through a wiring pattern (not illustrated) included in the wiring substrate 810 and are input to the corresponding drive circuit 52. The drive circuit 52 generates and outputs the corresponding drive signals COMA1 to COMA6, COMB1 to COMB6, COMC1 to COMC6 based on the input basic drive signals dA1 to dA6, dB1 to dB6, dC1 to dC6. A plurality of signals including the drive signals COMA1 to COMA6, COMB1 to COMB6, COMC1 to COMC6 output by the plurality of drive circuits 52 and the data signal DATA output by the integrated circuit 101 are supplied to the liquid discharge module 20 via the coupling portion CN2.

Here, FIG. 13 illustrates a case where the integrated circuit 101 is mounted on the wiring substrate 810 together with the plurality of drive circuits 52, but the integrated circuit 101 may be mounted on a substrate (not illustrated) different from the drive circuit 52. As illustrated in FIG. 13, by mounting the integrated circuit 101 on a substrate common to the plurality of drive circuits 52, it is possible to shorten the wiring length in which the signal is propagated between the plurality of drive circuits 52 and the integrated circuit 101. As a result, the possibility that noise or the like is superimposed on the signal propagating between the plurality of drive circuits 52 and the integrated circuit 101 is reduced. On the other hand, the plurality of drive circuits 52 generate a large amount of heat as compared with the integrated circuit 101. Therefore, there is a possibility that the stability of the operation of the integrated circuit 101 may decrease due to the heat generated in the plurality of drive circuits 52. By mounting the integrated circuit 101 on a substrate different from the plurality of drive circuits 52, it is possible to reduce the possibility that the heat generated in the plurality of drive circuits 52 contributes to the integrated circuit 101.

Returning to FIG. 12, in the head drive module 10, the heat sink 710 is located on the +Z2 side of the drive circuit substrate 800 and releases the heat generated in the drive circuit substrate 800. As a result, the possibility that the temperature of the drive circuit substrate 800 rises is reduced, and the stability of the operation of various circuits included in the drive circuit substrate 800 is improved. Such a heat sink 710 is a metal substance having high thermal conductivity and is configured to contain, for example, aluminum, iron, copper, and the like, from the viewpoint of efficiently releasing the heat generated in the drive circuit substrate 800.

The plurality of screws 780 fix the heat sink 710 to the drive circuit substrate 800. Specifically, each of the plurality of screws 780 is inserted through a plurality of through-holes 820 formed in the wiring substrate 810 included in the drive circuit substrate 800 from the −Z2 side toward the +Z2 side, and is fastened to the heat sink 710 located on the +Z2 side of the drive circuit substrate 800. As a result, the plurality of screws 780 attach the heat sink 710 to the drive circuit substrate 800.

Here, for example, rivets may be used for the plurality of screws 780, as long as the heat sink 710 can be fixed to the drive circuit substrate 800. Furthermore, a part of the heat sink 710 may insert the through-hole 820, and a part of the heat sink 710 through which the through-hole 820 is inserted may be attached to a metal portion of the drive circuit substrate 800 by soldering or the like.

The heat conductive member group 720 includes heat conductive members 730, 740, 750, and 760. Such a heat conductive member group 720 is located between the drive circuit substrate 800 and the heat sink 710 in the Z2 direction. The heat conductive member group 720 conducts the heat generated in the drive circuit substrate 800 to the heat sink 710, so that the release efficiency of heat generated in the drive circuit substrate 800 by the heat sink 710 is enhanced.

The heat conductive member 730 is located between the inductor L1 and the heat sink 710, and is in contact with both the inductor L1 and the heat sink 710 in a state where the heat sink 710 is attached to the drive circuit substrate 800. As a result, the heat generated in the inductor L1 is conducted to the heat sink 710 via the heat conductive member 760.

The heat conductive member 740 is located between the transistor M1 and the heat sink 710, and is in contact with both the transistor M1 and the heat sink 710 in a state where the heat sink 710 is attached to the drive circuit substrate 800. As a result, the heat generated in the transistor M1 is conducted to the heat sink 710 via the heat conductive member 740.

The heat conductive member 750 is located between the transistor M2 and the heat sink 710, and is in contact with both the transistor M2 and the heat sink 710 in a state where the heat sink 710 is attached to the drive circuit substrate 800. As a result, the heat generated in the transistor M2 is conducted to the heat sink 710 via the heat conductive member 750.

The heat conductive member 760 is located between the integrated circuit 101 and the heat sink 710, and is in contact with both the integrated circuit 101 and the heat sink 710 in a state where the heat sink 710 is attached to the drive circuit substrate 800. As a result, the heat generated in the integrated circuit 101 is conducted to the heat sink 710 via the heat conductive member 760.

Here, in FIG. 12, although the case is illustrated where each of the heat conductive members 730, 740, 750, and 760 included in the heat conductive member group 720 is individually provided for each element of the inductor L1, the transistors M1 and M2, and the integrated circuit 500 included in each of the plurality of drive circuits 52, in the head drive module 10, the heat conductive member group 720 may include one heat radiation body extending along the X2 direction and commonly provided for the inductor L1 included in each of the plurality of drive circuits 52 in place of the heat conductive member 730 or in addition to the heat conductive member 730. Similarly, the heat conductive member group 720 may include one heat radiation body extending along the X2 direction and commonly provided for the transistors M1 and M2 included in each of the plurality of drive circuits 52 in place of the heat conductive members 740 and 750, or in addition to the heat conductive members 740 and 750. Furthermore, the heat conductive member group 720 may include one heat radiation body extending along the X2 direction and commonly provided for the integrated circuit 500 included in each of the plurality of drive circuits 52 in place of the heat conductive members 760, or in addition to the heat conductive members 760.

Next, a specific example of a heat radiation structure of the drive circuit substrate 800 by the heat sink 710 and the heat conductive member group 720 will be described. FIG. 14 is a diagram illustrating an example of a cross section of the head drive module 10. FIG. 14 illustrates a cross-sectional view when the head drive module 10 is cut so as to pass through the inductor L1, the transistor M1, and the integrated circuit 500 included in the drive circuit 52.

As illustrated in FIG. 14, in the liquid discharge device 1 which is an example of the electronic device in the first embodiment, the head drive module 10 is provided with the wiring substrate 810, the heat sink 710 attached to the wiring substrate 810, the inductor L1 provided on the wiring substrate 810, the transistors M1 and M2 provided on the wiring substrate 810 and having a thickness smaller than that of the inductor L1 in the Z2 direction which is the normal direction of the wiring substrate 810, the integrated circuit 500 provided on the wiring substrate 810 and having a thickness smaller than that of the inductor L1 in the Z2 direction which is the normal direction of the wiring substrate 810, the heat conductive member 730 that is located between the inductor L1 and the heat sink 710 and conducts heat of the inductor L1 by coming into contact with the inductor L1, the heat conductive member 740 that is located between the transistor M1 and the heat sink 710, and conducts heat of the transistor M1 by coming into contact with the transistor M1, the heat conductive member 750 that is located between the transistor M2 and the heat sink 710, and conducts heat of the transistor M2 by coming into contact with the transistor M2, and the heat conductive member 760 that is located between the integrated circuit 500 and the heat sink 710, and conducts heat of the integrated circuit 500 by coming into contact with the integrated circuit 500.

As illustrated in FIG. 14, the heat sink 710 includes a bottom portion 711, side portions 712 and 713, protruding portions 715, 716, and 717, and a plurality of fin portions 718.

The bottom portion 711 is a substantially rectangular plate-shaped member located facing the wiring substrate 810 and extending in a plane formed by the X2 direction and the Y2 direction. The side portion 712 is a plate-shaped member that protrudes from the end portion of the bottom portion 711 on the −Y2 side toward the −Z2 side and extends along the X2 direction. At least a part of the end portion on the −Z2 side of the side portion 712 comes into contact with the end portion on the −Y2 side of the wiring substrate 810 and is attached to the wiring substrate 810 by the screw 780. The side portion 713 is a plate-shaped member that protrudes from the end portion of the bottom portion 711 on the +Y2 side toward the −Z2 side and extends along the X2 direction. At least a part of the end portion on the −Z2 side of the side portion 713 comes into contact with the end portion on the +Y2 side of the wiring substrate 810 and is attached to the wiring substrate 810 by the screw 780. As a result, the heat sink 710 is attached to the wiring substrate 810 included in the drive circuit substrate 800.

As described above, the bottom portion 711 and the side portions 712 and 713 form an accommodation space having an opening at least on the −Z2 side. By attaching the heat sink 710 to the wiring substrate 810, the plurality of drive circuits 52 are accommodated inside the accommodation space. That is, the bottom portion 711 and the side portions 712 and 713 are provided so as to cover the inductor L1, the transistors M1 and M2, and the integrated circuit 500 included in each of the plurality of drive circuits 52, and are attached to the wiring substrate 810. In other words, the heat sink 710 is attached to the wiring substrate 810 so as to cover the inductor L1, the transistors M1 and M2, and the integrated circuit 500 included in each of the plurality of drive circuits 52.

The protruding portion 715 is a plate-shaped member that protrudes from the bottom portion 711 toward the −Z2 side and extends along the X2 direction. The protruding portion 715 is located corresponding to the inductor L1 provided on the wiring substrate 810 when the heat sink 710 is attached to the wiring substrate 810. That is, in the head drive module 10, the protruding portion 715 protrudes from the bottom portion 711 toward the inductor L1. Here, as described above, the inductors L1 included in each of the plurality of drive circuits 52 are provided side by side in the X2 direction on the wiring substrate 810. That is, the heat sink 710 includes one protruding portion 715 corresponding to the plurality of inductors L1 provided on the wiring substrate 810.

The protruding portion 716 is a plate-shaped member that protrudes from the bottom portion 711 toward the −Z2 side and extends along the X2 direction. The protruding portion 716 is located corresponding to the transistor M1 provided on the wiring substrate 810 when the heat sink 710 is attached to the wiring substrate 810. That is, in the head drive module 10, the protruding portion 716 protrudes from the bottom portion 711 toward the transistor M1. Here, as described above, the transistors M1 included in the drive circuit 52 are provided side by side with the transistor M2 along the X2 direction, and the transistors M1 and M2 included in each of the plurality of drive circuits 52 are provided side by side along the X2 direction on the wiring substrate 810. That is, the heat sink 710 includes a plurality of transistors M1 provided on the wiring substrate 810 and one protruding portion 716 corresponding to the plurality of transistors M2.

The protruding portion 717 is a plate-shaped member that protrudes from the bottom portion 711 toward the −Z2 side and extends along the X2 direction. The protruding portion 717 is located corresponding to the integrated circuit 500 provided on the wiring substrate 810 when the heat sink 710 is attached to the wiring substrate 810. That is, in the head drive module 10, the protruding portion 717 protrudes from the bottom portion 711 toward the integrated circuit 500. Here, as described above, the integrated circuits 500 included in each of the plurality of drive circuits 52 are provided on the wiring substrate 810 side by side along the X2 direction on the wiring substrate 810. That is, the heat sink 710 includes one protruding portion 717 corresponding to the plurality of integrated circuits 500 provided on the wiring substrate 810.

The heat sink 710 may include a plurality of protruding portions 715 corresponding to each of the inductors L1 included in each of the plurality of drive circuits 52, may include a plurality of protruding portions 716 corresponding to each of the sets of transistors M1 and M2 included in each of the plurality of drive circuits 52, may include a plurality of protruding portions 716 corresponding to each of the plurality of transistors M1 included in the plurality of drive circuits 52, and a plurality of protruding portions 716 corresponding to each of the plurality of transistors M2, and may include a plurality of protruding portions 717 corresponding to each of the integrated circuits 500 included in each of the plurality of drive circuits 52.

Each of the plurality of fin portions 718 is a plate-shaped member that protrudes from the bottom portion 711 toward the −Z2 side and extends along the X2 direction, and is located apart from each other in the Y2 direction. The plurality of fin portions 718 makes it possible to increase a surface area of the heat sink 710 and improve the heat radiation performance of the heat sink 710. The number of such a plurality of fin portions 718 can be set based on the amount of heat released by the heat sink 710 from the heat generated in the drive circuit substrate 800, the length of the fin portions 718 along the Z2 direction, the optimum interval defined according to the air flow applied to the fin portion 718, and the like. Therefore, the number of fins included in the heat sink 710 is not limited to the example illustrated in FIG. 14. In addition, the fin portion 718 may be provided in a region where the fin portion 718 is not illustrated in FIG. 14, such as between the side portion 712 and the protruding portion 715, between the protruding portion 717 and the side portion 713, and on the +Z2 side of the bottom portion 711.

As described above, the heat conductive member group 720 includes the heat conductive members 730, 740, 750, and 760. Here, the heat conductive member 740 and the heat conductive member 750 are ideally positioned so as to overlap each other when viewed along the X2 direction in the head drive module 10. Therefore, in FIG. 14, only the heat conductive member 740 is illustrated, and the illustration of the heat conductive member 750 is omitted.

The heat conductive member 730 is located between the protruding portion 715 and the inductor L1, and is in contact with both the protruding portion 715 and the inductor L1. Specifically, the heat conductive member 730 includes a plastic heat conductor 732 and an elastic heat conductor 734. The plastic heat conductor 732 is in contact with the protruding portion 715 on the surface on the +Z2 side and is in contact with the elastic heat conductor 734 on the surface on the −Z2 side. The elastic heat conductor 734 is a sheet-like member having elasticity, and is in contact with the plastic heat conductor 732 on the surface on the +Z2 side and in contact with the inductor L1 on the surface on the −Z2 side. That is, the plastic heat conductor 732 and the elastic heat conductor 734 are in contact with each other, the plastic heat conductor 732 is in contact with the heat sink 710, and the elastic heat conductor 734 is located between the plastic heat conductor 732 and the inductor L1 and is in contact with the inductor L1. As a result, the heat generated in the inductor L1 is conducted to the heat sink 710 via the elastic heat conductor 734 and the plastic heat conductor 732. That is, the heat conductive member 730 conducts the heat generated in the inductor L1 to the heat sink 710.

Here, in the plastic heat conductor 732 and the elastic heat conductor 734 included in the heat conductive member 730, the elastic heat conductor 734 may be in contact with the protruding portion 715 on the surface on the +Z2 side and in contact with the plastic heat conductor 732 on the surface on the −Z2 side, and the plastic heat conductor 732 may be in contact with the elastic heat conductor 734 on the surface on the +Z2 side and in contact with the inductor L1 on the surface on the −Z2 side. That is, the plastic heat conductor 732 and the elastic heat conductor 734 may be in contact with each other, the plastic heat conductor 732 may be in contact with the inductor L1, and the elastic heat conductor 734 may be located between the plastic heat conductor 732 and the heat sink 710 and may be in contact with the heat sink 710.

The heat conductive member 740 is located between the protruding portion 716 and the transistor M1 and comes into contact with both the protruding portion 716 and the transistor M1. Specifically, the heat conductive member 740 is a sheet-like member having elasticity, is in contact with the protruding portion 716 on the surface on the +Z2 side, and is in contact with the transistor M1 on the surface on the −Z2 side. As a result, the heat conductive member 740 conducts the heat generated in the transistor M1 to the heat sink 710.

In addition, the heat conductive member 750 (not illustrated in FIG. 14) is located between the protruding portion 716 and the transistor M2, and comes into contact with both the protruding portion 716 and the transistor M2. Specifically, the heat conductive member 750 is a sheet-like member having elasticity, is in contact with the protruding portion 716 on the surface on the +Z2 side, and is in contact with the transistor M2 on the surface on the −Z2 side. As a result, the heat conductive member 750 conducts the heat generated in the transistor M2 to the heat sink 710.

The heat conductive member 760 is located between the protruding portion 717 and the integrated circuit 500, and comes into contact with both the protruding portion 717 and the integrated circuit 500. Specifically, the heat conductive member 760 is a sheet-like member having elasticity, is in contact with the protruding portion 717 on the surface on the +Z2 side, and is in contact with the integrated circuit 500 on the surface on the −Z2 side. As a result, the heat conductive member 760 conducts the heat generated in the integrated circuit 500 to the heat sink 710.

In the head drive module 10 configured as described above, due to various tolerances such as an attachment error of the heat sink 710 to the wiring substrate 810, mounting variations of the inductor L1, the transistors M1 and M2, and the integrated circuit 500 on the wiring substrate 810, and variations in the component dimensions of the heat sink 710, the inductor L1, the transistors M1 and M2, and the integrated circuit 500, even when the heat sink 710 is attached to the wiring substrate 810, the contact state between the heat sink 710 and the inductors L1, the transistors M1 and M2, and the integrated circuit 500 mounted on the wiring substrate 810 varies. As a result, there is a possibility that the heat generated in the integrated circuit 500, the transistors M1 and M2, and the inductor L1 mounted on the wiring substrate 810 cannot be sufficiently released through the heat sink 710. Furthermore, when the heat sink 710 is attached to the wiring substrate 810, unintended stress is applied to the inductor L1, the transistors M1 and M2, and the integrated circuit 500. As a result, there is also a possibility that the head drive module 10 may malfunction.

In response to such a problem, the head drive module 10 of the first embodiment includes the elastic heat conductor 734, which is a sheet-like member having elasticity corresponding to each of the inductor L1, the transistors M1 and M2, and the integrated circuit 500, and the heat conductive members 740, 750, and 760. Therefore, when the heat sink 710 is attached to the wiring substrate 810, the elastic heat conductor 734 and the heat conductive members 740, 750, and 760 reduce the variation in the contact state between the heat sink 710 and the drive circuit substrate 800. As a result, it is possible to reduce the possibility that the heat generated in the inductor L1, the transistors M1 and M2, and the integrated circuit 500 mounted on the wiring substrate 810 cannot be sufficiently released through the heat sink 710. The possibility of unintended stress being applied to the inductor L1, the transistors M1 and M2, and the integrated circuit 500 mounted on the wiring substrate 810 is also reduced, and the stability of the operation of the head drive module 10 is improved.

Furthermore, as described above, the heat sink 710 is a substance having high thermal conductivity, and a metal such as aluminum or iron is used. Therefore, when the heat sink 710 is in electrical contact with the inductor L1, the transistors M1, M2, and the integrated circuit 500, there is a possibility that the inductor L1, the transistors M1, M2, and the integrated circuit 500 may malfunction. In response to such a problem, in the liquid discharge device 1 of the first embodiment, the elastic heat conductor 734 having an insulating property and the heat conductive members 740, 750, and 760 are located between the heat sink 710, the inductor L1, the transistors M1 and M2, and the integrated circuit 500. Therefore, the possibility of electrical contact between the heat sink 710 and the inductor L1, the transistors M1 and M2, and the integrated circuit 500 is reduced, and the possibility of malfunction in the drive circuit 52 including the inductor L1, the transistors M1 and M2, and the integrated circuit 500 is reduced.

As the elastic heat conductor 734 and the heat conductive members 740, 750, and 760, a gel sheet or a rubber sheet which is a substance having flame retardancy and electrical insulation in addition to elasticity and which contains, for example, silicone or acrylic resin and has thermal conductivity can be used. The elastic heat conductor 734 and the heat conductive members 740, 750, and 760 may be at least a substance that can efficiently conduct heat between the heat sink 710, the inductor L1, the transistors M1 and M2, and the integrated circuit 500, may be a substance having a small elastic force, and may be, for example, a putty type material.

In addition, when the heat generated in the inductor L1 is released by using the heat sink 710, since the heat sink 710 is made of a metal such as aluminum, iron, and copper having excellent thermal conductivity, the magnetic field generated around the inductor L1 interferes with the heat sink 710. As a result, there is a possibility that the stability of the operation of the head drive module 10 may decrease.

Specifically, due to the influence of the magnetic field generated around the inductor L1, an induced current is generated in the heat sink 710. As a result, there is a possibility that the heat sink 710 may generate heat and the heat radiation performance with respect to the drive circuit substrate 800 may decrease. In addition, due to the influence of the heat sink 710, the magnetic field generated around the inductor L1 is distorted. As a result, there is a possibility that the waveform accuracy of the drive signal COM output by the drive circuit 52 may decrease.

In response to such a problem, it is required to dispose the heat sink 710 away from the inductor L1, but when the heat sink 710 is disposed away from the inductor L1, there is a possibility that the heat radiation performance of the drive circuit substrate 800 by the heat sink 710 may decrease. Therefore, in the head drive module 10 of the first embodiment, the heat conductive member 730 that propagates the heat generated in the inductor L1 to the heat sink 710 includes the plastic heat conductor 732 in addition to the elastic heat conductor 734 having elasticity. As a result, the heat sink 710 can be disposed away from the inductor L1, and the possibility that the magnetic field generated around the inductor L1 interferes with the heat sink 710 is reduced. As a result, the possibility that the stability of the operation of the head drive module 10 may decrease is reduced.

The plastic heat conductor 732 is preferably a substance having a higher thermal conductivity than that of the elastic heat conductor 734, and for example, fine ceramics, specifically, alumina ($Al_2O_3$) can be used. Alumina is not easily affected by the magnetic field generated in the inductor L1, and since alumina has high electrical insulation, alumina is not easily affected by induced current. Furthermore, the thermal conductivity of alumina is approximately 30 W/m·K, which is higher than the thermal conductivity of a gel sheet or rubber sheet containing silicone or acrylic resin. Therefore, the heat generated in the inductor L1 can be efficiently conducted to the heat sink 710, compared with the case where the heat sink 710 is disposed away from the inductor L1 using only the elastic heat conductor 734. That is, in the head drive module 10 of the first embodiment, the heat conductive member 730 located between the inductor L1 and the heat sink 710 and conducting heat of the inductor L1 includes the plastic heat conductor 732 and the elastic heat conductor 734. By providing the plastic heat conductor 732 and the elastic heat conductor 734 in contact with each other, the heat generated in the inductor L1 can be efficiently propagated to the heat sink 710, and the possibility that the magnetic field generated in the inductor L1 interferes with the heat sink 710 is reduced. As a result, the possibility that the stability of the operation of the head drive module 10 may decrease can be reduced.

In addition, the thermal conductivity of aluminum that can be used as the material of the heat sink 710 is approximately 200 W/m·K, the thermal conductivity of iron is approximately 70 W/m·K, and the thermal conductivity of copper is approximately 380 W/m·K. As a result, the thermal conductivity of the heat sink 710 is higher than the thermal conductivity of alumina that can be used as the plastic heat conductor 732, and higher than the thermal conductivity of the elastic heat conductor 734 and the heat conductive members 740, 750, and 760. Therefore, from the viewpoint of increasing a heat radiation efficiency of the heat sink 710, it is preferable that the transistors M1 and M2 and the integrated circuit 500, which do not easily generate a magnetic field in the surroundings and have a large amount of heat, and the heat sink 710 are as close as possible to each other. That is, the inductor L1, which is provided on the wiring substrate 810, has a high component height, and generates a magnetic field, is preferably located away from the heat sink 710 attached to the wiring substrate 810. On the other hand, the transistors M1 and M2 and the integrated circuit 500, which are provided on the wiring substrate 810, have a low component height, and hardly generate a magnetic field, are preferably located in the vicinity of the heat sink 710 attached to the wiring substrate 810.

In response to such a problem, the heat sink 710 included in the head drive module 10 in the first embodiment has a configuration in which the length of the protruding portion 715 in the Z2 direction, which is the normal direction of the wiring substrate 810, is shorter than the length of the protruding portion 716 in the Z2 direction, which is the normal direction of the wiring substrate 810, and is shorter than the length of the protruding portion 717 in the Z2 direction, which is the normal direction of the wiring substrate 810.

As a result, in the head drive module 10, for the purpose of absorbing the difference in component height between the inductor L1, the transistors M1 and M2, and the integrated circuit 500, it is not necessary to make the heat conductive members 730, 740, and 750 thicker than necessary. Furthermore, it is not necessary to interpose another configuration for conducting heat between the heat sink 710, the transistors M1 and M2, and the integrated circuit 500. As a result, the heat generated in each of the inductor L1, the transistors M1 and M2, and the integrated circuit 500 can be efficiently conducted to the heat sink 710, and the heat generated in each of the inductor L1, the transistors M1 and M2, and the integrated circuit 500 is efficiently released.

In particular, in the head drive module 10 as described in the first embodiment, the plastic heat conductor 732 is located between the inductor L1 and the heat sink 710 from the viewpoint of improving the stability of operation. Even with such a configuration, in the heat sink 710, the length of the protruding portion 715 corresponding to the inductor L1 is shorter than the length of the protruding portion 716 corresponding to the transistors M1 and M2, and shorter than the length of the protruding portion 717 corresponding to the integrated circuit 500. Therefore, it is possible to realize an efficient release of heat generated in the head drive module 10. That is, in the head drive module 10 described in the first embodiment, it is possible to realize both improvement of the stability of the operation of the head drive module 10 and efficient release of heat generated in the head drive module 10.

In addition, the heat sink 710 is attached to the wiring substrate 810 included in the drive circuit substrate 800, and the plurality of drive circuits 52 included in the drive circuit substrate 800 are accommodated in the accommodation space formed by the bottom portion 711 and the side portions 712 and 713. Therefore, a plurality of spaces including internal spaces WT1, WT2, WT3, and WT4 are configured inside the head drive module 10.

The internal space WT1 is a space including the bottom portion 711 included in the heat sink 710, the side portion 712, the protruding portion 715, the wiring substrate 810, the inductor L1 provided on the wiring substrate 810, and the heat conductive member 730 located between the inductor L1 and the protruding portion 715, and extends along the X2 direction. That is, the internal space WT1 is configured to include the wiring substrate 810, the inductor L1, the bottom portion 711, and the side portion 712.

The internal space WT2 is a space including the bottom portion 711 included in the heat sink 710, the protruding portions 715 and 716, the wiring substrate 810, the transistor M1 and the inductor L1 provided on the wiring substrate 810, the heat conductive member 730 located between the inductor L1 and the protruding portion 715, and the heat conductive member 740 located between the transistor M1 and the protruding portion 716, and extends along the X2 direction. That is, in the Y2 direction intersecting the Z2 direction which is the normal direction of the wiring substrate 810, the inductor L1 and the transistor M1 are located apart from each other, and the wiring substrate 810, the inductor L1, the transistor M1 and the bottom portion 711 constitute the internal space WT2. Here, the heat conductive member 750 and the transistor M2 may be included in at least a part of the internal space WT2.

The internal space WT3 is a space including the bottom portion 711 included in the heat sink 710, the protruding portions 716 and 717, the wiring substrate 810, the transistor M1 and the integrated circuit 500 provided on the wiring substrate 810, the heat conductive member 740 located between the transistor M1 and the protruding portion 716, and the heat conductive member 760 located between the integrated circuit 500 and the protruding portion 717, and extends along the X2 direction. That is, the transistor M1 and the integrated circuit 500 are located apart from each other in the Y2 direction intersecting the Z2 direction, which is the normal direction of the wiring substrate 810. The wiring substrate 810, the transistor M1, the integrated circuit 500, and the bottom portion 711 constitute the internal space WT3. Here, the heat conductive member 750 and the transistor M2 may be included in at least a part of the internal space WT3.

The internal space WT4 is a space including the bottom portion 711 included in the heat sink 710, the side portion 713, the protruding portion 717, the wiring substrate 810, the integrated circuit 500 provided on the wiring substrate 810, and the heat conductive member 760 located between the integrated circuit 500 and the protruding portion 717, and extends along the X2 direction. That is, the internal space WT4 is configured to include the wiring substrate 810, the integrated circuit 500, the bottom portion 711, and the side portion 713.

Since the plurality of spaces including the internal spaces WT1, WT2, WT3, and WT4 are configured inside the head drive module 10, a surface area of a conduction path is increased when the heat generated in the inductor L1, the transistors M1 and M2, and the integrated circuit 500 is conducted to the heat sink 710. As a result, the heat conduction efficiency generated in each of the inductor L1, the transistors M1 and M2, and the integrated circuit 500 by the protruding portions 715, 716, and 717 increases. As a result, the release efficiency of heat generated in the inductor L1, the transistors M1 and M2, and the integrated circuit 500 by the heat sink 710 is improved. That is, since the inside of the head drive module 10 has the plurality of spaces including the internal spaces WT1, WT2, WT3, and WT4, the heat conduction efficiency in the heat sink 710 is increased. As a result, the release efficiency of heat generated in the inductor L1, the transistors M1 and M2, and the integrated circuit 500 is improved.

In addition, it is preferable that the plurality of spaces including the internal spaces WT1, WT2, WT3, and WT4 configured inside the head drive module 10 are partially provided with an opening communicating with the head drive module 10. As a result, the outside air is introduced into the plurality of spaces including the internal spaces WT1, WT2, WT3, and WT4, and the air floating in the plurality of spaces including the internal spaces WT1, WT2, WT3, and WT4 circulates. As a result, the release efficiency of heat generated in each of the inductor L1, the transistors M1 and M2, and the integrated circuit 500 by the heat sink 710 is further improved.

In this case, it is preferable that the opening communicating with the head drive module 10 is formed at least one of an end portion on the −X2 side and an end portion on the +X2 side of the plurality of spaces including the internal spaces WT1, WT2, WT3, and WT4 extending along the X2 direction. As a result, the outside air floating around the head drive module 10 can be introduced into a wider area of the plurality of spaces including the internal spaces WT1, WT2, WT3, and WT4. As a result, the circulation efficiency of air floating in the plurality of spaces including the internal spaces WT1, WT2, WT3, and WT4 is further improved, and the release efficiency of heat generated in each of the inductor L1, the transistors M1 and M2, and the integrated circuit 500 by the heat sink 710 is further improved.

In addition, the head drive module 10 may include the cooling fan 770 as illustrated in FIG. 12. The cooling fan 770 introduces the outside air into the head drive module 10 through an opening portion 714 provided in an upper portion of the heat sink 710 on the −X2 side.

Specifically, the opening portion 714 is an opening that communicates with the inside of the head drive module 10, and preferably communicates with the plurality of spaces including the internal spaces WT1, WT2, WT3, and WT4. By operating the cooling fan 770, the outside air is introduced into the inside of the head drive module 10 through the opening portion 714. That is, the cooling fan 770 introduces gas between the inductor L1 and the transistor M1. As a result, the circulation efficiency of air floating inside the head drive module 10 including the plurality of spaces including the internal spaces WT1, WT2, WT3, and WT4 is further improved. As a result, the release efficiency of heat generated in each of the inductor L1, the transistors M1 and M2, and the integrated circuit 500 by the heat sink 710 is further improved.

Here, the fact that the cooling fan 770 introduces the outside air into the head drive module 10 is not limited to driving the cooling fan 770 so as to directly take in the outside air, and includes the case where the outside air is introduced into the inside of the head drive module 10 through the opening formed in the head drive module 10 by driving the cooling fan 770 so as to discharge the air floating inside the head drive module 10 to the outside.

The liquid discharge device 1 configured as described above is an example of an electronic device, the wiring substrate 810 is an example of a substrate, and the inductor L1 provided on the wiring substrate 810 is an example of a first electronic component. The transistor M1 provided on the wiring substrate 810 and having a component height lower than that of the inductor L1 is an example of a second electronic component. The integrated circuit 500 provided on the wiring substrate 810 and having a component height lower than that of the inductor L1 is an example of a third electronic component. In addition, the inductor L1 is an example of an inductor element, the transistor M1 is an example of a transistor element, and the integrated circuit 500 is an example of an integrated circuit device. In addition, the protruding portion 715 included in the heat sink 710 is an example of a first protruding portion, the protruding portion 716 is an example of a second protruding portion, and the protruding portion 717 is an example of a third protruding portion. In addition, the heat conductive member 730 is an example of a first heat conductive member, the heat conductive member 740 is an example of a second heat conductive member, and the heat conductive member 760 is an example of a third heat conductive member. The internal space WT2 formed inside the head drive module 10 is an example of a wind tunnel space, and the cooling fan 770 that introduces outside air as a gas inside the head drive module 10 is an example of a blower fan.

1.6 Action and Effect

In the liquid discharge device 1 of the first embodiment configured as described above, the heat sink 710 included in the head drive module 10 is provided so as to cover various electronic components of the drive circuit 52 including the inductor L1 and the transistor M1, includes the base portion including the bottom portion 711, and the side portions 712, and 713 attached to the wiring substrate 810 of the drive circuit substrate 800, the protruding portion 715 protruding from the bottom portion 711 toward the inductor L1 and comes into contact with the heat conductive member 730, and the protruding portion 716 protruding from the bottom portion 711 toward the transistor M1 and comes into contact with the heat conductive member 740, and has a characteristic configuration in which the length of the protruding portion 715 along the Z2 direction corresponding to the normal direction of the wiring substrate 810 is shorter than the length of the protruding portion 716 along the Z2 direction corresponding to the normal direction of the wiring substrate 810. That is, the heat sink 710 is attached to the wiring substrate 810 so as to cover various electronic components including the inductor L1 and the transistor M1 provided on the wiring substrate 810, and includes a plurality of protruding portions having different lengths depending on various electronic components including the inductor L1 and the transistor M1, and for releasing heat of various electronic components including the inductor L1 and the transistor M1.

As a result, the height and dimensions including the inductor L1 and the transistor M1 are different, and the possibility is reduced that the contact state varies due to the difference in height and dimensions between a plurality of electronic components that generate heat and the heat sink 710 attached to the wiring substrate 810 so as to cover various electronic components that generate heat and includes the inductor L1 and the transistor M1 provided on the wiring substrate 810. As a result, the release efficiency of heat of various electronic components including the inductor L1 and the transistor M1 provided on the wiring substrate 810 by the heat sink 710 is improved. That is, the heat sink 710 can efficiently release heat generated in the plurality of electronic components having different sizes and dimensions.

In addition, the liquid discharge device 1 of the first embodiment includes the heat conductive member 730 that comes into contact with both the inductor L1 and the protruding portion 715 included in the heat sink 710, and the heat conductive member 740 that comes into contact with both the transistor M1 and the protruding portion 716 included in the heat sink 710. As a result, in the state where the heat sink 710 is attached to the wiring substrate 810, the heat conductive member 730 functions as a cushioning material between the inductor L1 and the heat sink 710, and the heat conductive member 740 functions as a cushioning material between the transistor M1 and the heat sink 710. As a result, due to variations and errors that occur when the heat sink 710 is attached to the wiring substrate 810, the possibility of variation in the contact state between the inductor L1 and the protruding portion 715 of the heat sink 710 and between the transistor M1 and the protruding portion 716 of the heat sink 710 is reduced. The release efficiency of heat generated in the inductor L1 and the transistor M1 is improved, the possibility that unintended stress is applied to the inductor L1 and the transistor M1 is reduced, and the reliability of the operation of the liquid discharge device 1 is improved.

In addition, in the liquid discharge device 1 of the first embodiment, the heat conductive member 730 includes the plastic heat conductor 732 and the elastic heat conductor 734, and the plastic heat conductor 732 and the elastic heat conductor 734 are in contact with each other. As a result, even when the heat sink 710 releases heat from the electronic component that generates a magnetic field such as the inductor L1, it is possible to secure a distance between the heat sink 710, which is generally made of a metal having high thermal conductivity, and the electronic component that generates a magnetic field such as the inductor L1 by the elastic heat conductor 734. As a result, the possibility is reduced that the stability of the operation decreases due to the interference of the metal heat sink 710 with the magnetic field generated in the electronic component such as the inductor L1. The heat sink 710 generates heat due to the induced current generated by the magnetic field generated in the electronic component such as the inductor L1, and the possibility is reduced that the release efficiency of heat generated in the electronic component such as the inductor L1 decrease. That is, the heat conductive member 730 includes the plastic heat conductor 732 and the elastic heat conductor 734, and the plastic heat conductor 732 and the elastic heat conductor 734 are in contact with each other. Therefore, even the electronic component such as the inductor L1 that generates a magnetic field can efficiently release heat without deteriorating the stability of operation.

1.7 Modification Example

As described above, in the head drive module 10 included in the liquid discharge device 1 of the first embodiment, it is described that the heat conductive member 740 releases the heat generated in the transistor M1 to the protruding portion 716, and the heat conductive member 750 releases the heat generated in the transistor M2 to the protruding portion 716.

The transistor M1 and the transistor M2 may be one substance having flame retardancy and electrical insulation, and the heat generated in the transistor M1 and the transistor M2 may be released to the protruding portion 716 via a gel sheet or a rubber sheet containing silicone or acrylic resin and having thermal conductivity. Even in this case, the same action and effect as those of the above-described embodiment can be obtained.

2. Second Embodiment

Next, a liquid discharge device 1 as an example of an electronic device of a second embodiment will be described. In describing the liquid discharge device 1 of the second embodiment, the same reference numerals are given to the same configurations, and the description thereof will be simplified or omitted. In the liquid discharge device 1 according to the second embodiment, the size of each of the heat conductive member 730 located between the heat sink 710 and the inductor L1, the heat conductive member 740 located between the heat sink 710 and the transistor M1, and the heat conductive member 760 located between the heat sink 710 and the integrated circuit 500 is different from that of the liquid discharge device 1 in the first embodiment.

Figure 15:
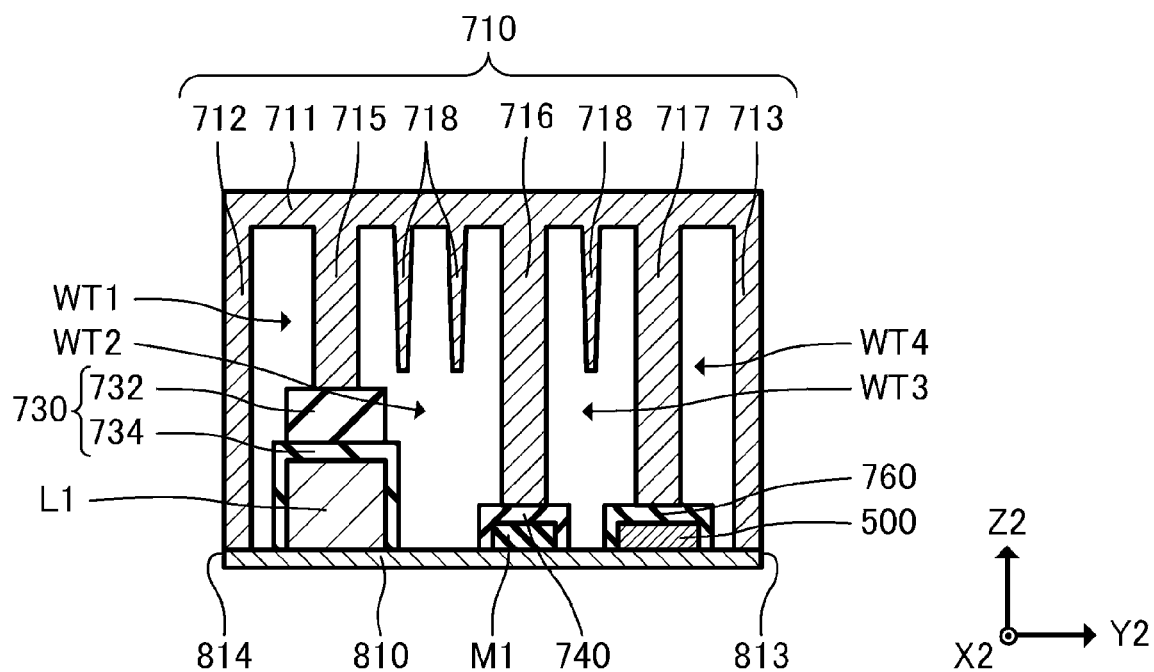
FIG. 15 is a diagram illustrating an example of a cross section of a head drive module of a second embodiment.

FIG. 15 is a diagram illustrating an example of a cross section of a head drive module 10 of the second embodiment. Similar to FIG. 14, FIG. 15 illustrates a cross-sectional view when the head drive module 10 is cut so as to pass through the inductor L1, the transistor M1, and the integrated circuit 500 included in the drive circuit 52.

As illustrated in FIG. 15, the head drive module 10 of the second embodiment differs from the head drive module 10 included in the liquid discharge device 1 of the first embodiment in that the elastic heat conductor 734 included in the heat conductive member 730 located between the inductor L1 and the protruding portion 715 of the heat sink 710 is larger than the inductor L1, the heat conductive member 740 located between the transistor M1 and the protruding portion 716 of the heat sink 710 is larger than the transistor M1, and the heat conductive member 760 located between the integrated circuit 500 and the protruding portion 717 of the heat sink 710 is larger than the integrated circuit 500.

Specifically, the elastic heat conductor 734 included in the heat conductive member 730 located between the inductor L1 and the protruding portion 715 of the heat sink 710 is larger than the size of the inductor L1 when the head drive module 10 is viewed along the X2 direction intersecting the Z2 direction which is the normal direction of the wiring substrate 810. Therefore, the elastic heat conductor 734 is curved in the −Z2 direction on the +Y2 side of the inductor L1 and the −Y2 side of the inductor L1. As a result, the elastic heat conductor 734 and the inductor L1 also come into contact with each other on the side surface of the inductor L1. As a result, of the heat generated in the inductor L1, the heat released from the side surface of the inductor L1 can also be conducted through the elastic heat conductor 734 and released from the heat sink 710.

Furthermore, as illustrated in FIG. 15, at least a part of the elastic heat conductor 734 curved in the −Z2 direction on the +Y2 side of the inductor L1 and the −Y2 side of the inductor L1 comes into contact with the wiring substrate 810. Therefore, of the heat generated in the inductor L1, the heat conducted and released to the wiring substrate 810 can also be conducted through the elastic heat conductor 734 and released from the heat sink 710.

That is, in the head drive module 10 of the second embodiment, the size of the heat conductive member 730 including the elastic heat conductor 734 when viewed from the X2 direction intersecting the Z2 direction, which is the normal direction of the wiring substrate 810, is larger than the size of the inductor L1 when viewed from the X2 direction intersecting the Z2 direction, which is the normal direction of the wiring substrate 810. Therefore, the heat conductive member 730 including the elastic heat conductor 734 can more efficiently conduct the heat generated in the inductor L1 to the heat sink 710.

Similarly, the heat conductive member 740 located between the transistor M1 and the protruding portion 716 of the heat sink 710 is larger than the size of the transistor M1, when the head drive module 10 is viewed along the X2 direction intersecting the Z2 direction, which is the normal direction of the wiring substrate 810. Therefore, the heat conductive member 740 is curved in the −Z2 direction on the +Y2 side of the transistor M1 and the −Y2 side of the transistor M1. As a result, the heat conductive member 740 and the transistor M1 also come into contact with each other on the side surface of the transistor M1. As a result, of the heat generated in the transistor M1, the heat released from the side surface of the transistor M1 can also be conducted through the heat conductive member 740 and released from the heat sink 710.

Furthermore, as illustrated in FIG. 15, at least a part of the heat conductive member 740 curved in the −Z2 direction on the +Y2 side of the transistor M1 and the −Y2 side of the transistor M1 comes into contact with the wiring substrate 810. Therefore, of the heat generated in the transistor M1, the heat conducted and released to the wiring substrate 810 can also be conducted through the heat conductive member 740 and released from the heat sink 710.

That is, in the head drive module 10 of the second embodiment, the size of the heat conductive member 740 when viewed from the X2 direction intersecting the Z2 direction, which is the normal direction of the wiring substrate 810, is larger than the size of the transistor M1 when viewed from the X2 direction intersecting the Z2 direction, which is the normal direction of the wiring substrate 810. Therefore, the heat conductive member 740 can more efficiently conduct the heat generated in the transistor M1 to the heat sink 710.

Similarly, the heat conductive member 760 located between the integrated circuit 500 and the protruding portion 717 of the heat sink 710 is larger than the size of the integrated circuit 500, when the head drive module 10 is viewed along the X2 direction intersecting the Z2 direction, which is the normal direction of the wiring substrate 810. Therefore, the heat conductive member 760 is curved in the −Z2 direction on the +Y2 side of the integrated circuit 500 and the −Y2 side of the integrated circuit 500. As a result, the heat conductive member 760 and the integrated circuit 500 also come into contact with each other on the side surface of the integrated circuit 500. As a result, of the heat generated in the integrated circuit 500, the heat released from the side surface of the integrated circuit 500 can also be conducted through the heat conductive member 760 and released from the heat sink 710.

Furthermore, as illustrated in FIG. 15, at least a part of the heat conductive member 760 curved in the −Z2 direction on the +Y2 side of the integrated circuit 500 and the −Y2 side of the integrated circuit 500 comes into contact with the wiring substrate 810. Therefore, of the heat generated in the integrated circuit 500, the heat conducted and released to the wiring substrate 810 can also be conducted through the heat conductive member 760 and released from the heat sink 710.

That is, in the head drive module 10 of the second embodiment, the size of the heat conductive member 760 when viewed from the X2 direction intersecting the Z2 direction, which is the normal direction of the wiring substrate 810, is larger than the size of the integrated circuit 500 when viewed from the X2 direction intersecting the Z2 direction, which is the normal direction of the wiring substrate 810. Therefore, the heat conductive member 760 can more efficiently conduct the heat generated in the integrated circuit 500 to the heat sink 710.

Here, in the head drive module 10 of the second embodiment, it is described that the size of the heat conductive members 730, 740, and 760 when viewed from the X2 direction intersecting the Z2 direction, which is the normal direction of the wiring substrate 810, is larger than the size of the inductor L1, the transistor M1, and the integrated circuit 500 when viewed from the X2 direction intersecting the Z2 direction, which is the normal direction of the wiring substrate 810. The size of the heat conductive members 730, 740, and 760, when viewed from the Y2 direction intersecting the Z2 direction, which is the normal direction of the wiring substrate 810, may be larger than the size of the inductor L1, the transistor M1, and the integrated circuit 500, when viewed from the Y2 direction intersecting the Z2 direction, which is the normal direction of the wiring substrate 810. The size of the heat conductive members 730, 740, and 760, when viewed from both the X2 direction and the Y2 direction intersecting the Z2 direction, which is the normal direction of the wiring substrate 810, may be larger than the size of the inductor L1, the transistor M1, and the integrated circuit 500, when viewed from both the X2 direction and the Y2 direction intersecting the Z2 direction, which is the normal direction of the wiring substrate 810.

In addition, although not illustrated in FIG. 15, the size of the heat conductive member 750 when viewed from at least one of the X2 direction and the Y2 direction intersecting the Z2 direction, which is the normal direction of the wiring substrate 810, may be larger than the size of the transistor M2 when viewed from at least one of the X2 direction and the Y2 direction intersecting the Z2 direction, which is the normal direction of the wiring substrate 810.

The liquid discharge device 1 as an example of the electronic device of the second embodiment configured as described above exhibits the same action and effect as those of the liquid discharge device 1 of the first embodiment, and can further enhance the heat radiation efficiency of the heat generated in the inductor L1, the transistors M1 and M2, and the integrated circuit 500 by the heat sink 710.

3. Third Embodiment

Next, a liquid discharge device 1 as an example of an electronic device of a third embodiment will be described. In describing the liquid discharge device 1 of the third embodiment, the same reference numerals are given to the same configurations as those of the first embodiment and the second embodiment, and the description thereof will be simplified or omitted. The liquid discharge device 1 according to the third embodiment differs from the liquid discharge device 1 in the first embodiment and the second embodiment in that the heat conductive member group 720 is located between the heat sink 710, the transistor M1, and the integrated circuit 500 and includes a heat conductive member 745 in contact with both the transistor M1 and the integrated circuit 500. Although the description is omitted, the size of the heat conductive member 750 located between the heat sink 710 and the transistor M2 may be different from that of the liquid discharge device 1 in the first embodiment.

Figure 16:
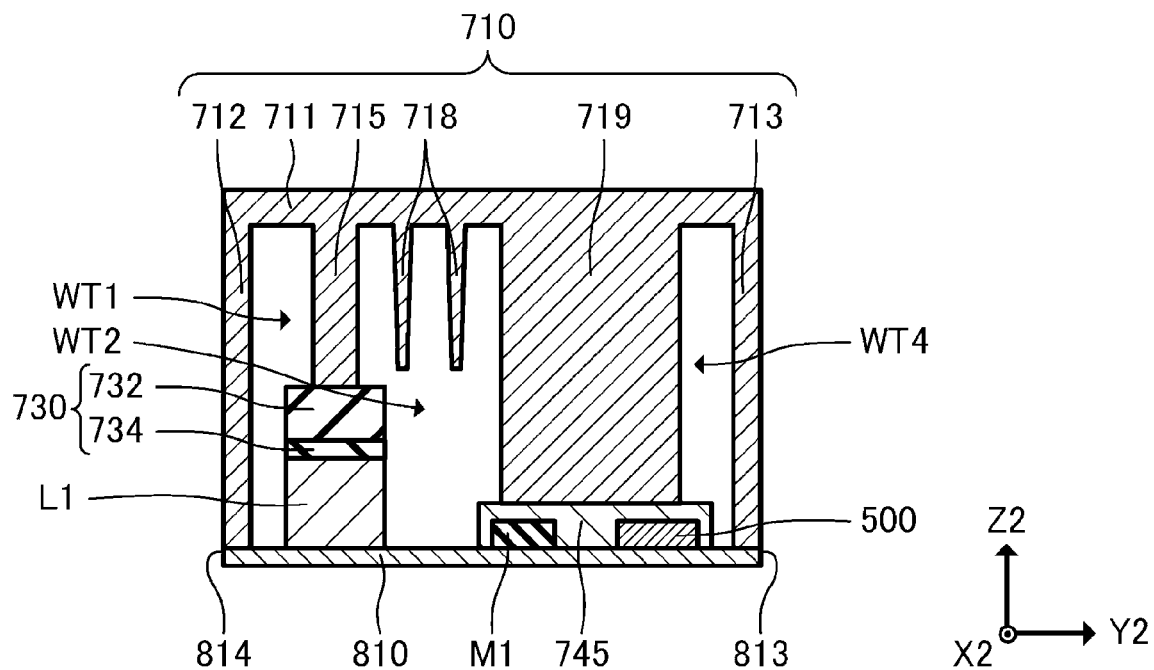
FIG. 16 is a diagram illustrating an example of a cross section of a head drive module according to a third embodiment.

FIG. 16 is a diagram illustrating an example of a cross section of a head drive module 10 of the third embodiment. Similar to FIGS. 14 and 15, FIG. 16 illustrates a cross-sectional view when the head drive module 10 is cut so as to pass through the inductor L1, the transistor M1, and the integrated circuit 500 included in the drive circuit 52.

As illustrated in FIG. 16, in the head drive module 10 of the third embodiment, the heat sink 710 includes a protruding portion 719 protruding from the bottom portion 711 toward the transistor M1 and the integrated circuit 500 instead of the protruding portions 716 and 717. In addition, the heat conductive member group 720 includes the heat conductive member 745 located between the protruding portion 719, the transistor M1, and the integrated circuit 500 instead of the heat conductive members 740 and 750, and comes into contact with the protruding portion 719, the transistor M1, and the integrated circuit 500.

The heat conductive member 745 is a sheet-like member having elasticity, is in contact with the protruding portion 719 on the surface on the +Z2 side, and in contact with the transistor M1 and the integrated circuit 500 on the surface on the −Z2 side. That is, the heat conductive member 745 is in contact with the protruding portion 719 on the surface on the +Z2 side, and in contact with the transistor M1 on the surface on the −Z2 side, and at least a part of the heat conductive member 745 is in contact with the integrated circuit 500. In other words, the heat conductive member 745 conducts the heat generated in the transistor M1 and the integrated circuit 500 to the heat sink 710 via the protruding portion 719.

In this case, the heat conductive member 745 located between the transistor M1, the integrated circuit 500, and the protruding portion 719 of the heat sink 710 is larger than the sum of the size of the transistor M1 and the size of the integrated circuit 500 when the head drive module 10 is viewed along the X2 direction intersecting the Z2 direction, which is the normal direction of the wiring substrate 810. Therefore, the heat conductive member 745 is curved in the −Z2 direction on the +Y2 side of the transistor M1, the −Y2 side of the transistor M1, the +Y2 side of the integrated circuit 500, and the −Y2 side of the integrated circuit 500. As a result, the heat conductive member 745 and the transistor M1 are in contact with each other on the side surface of the transistor M1, and the heat conductive member 745 and the integrated circuit 500 are also in contact with each other on the side surface of the integrated circuit 500. As a result, of the heat generated in the transistor M1 and the integrated circuit 500, the heat released from the side surface of the transistor M1 and the integrated circuit 500 can also be conducted through the heat conductive member 745 and released from the heat sink 710.

That is, in the head drive module 10 of the third embodiment, the size of the heat conductive member 745 when viewed from the X2 direction intersecting the Z2 direction, which is the normal direction of the wiring substrate 810, is larger than the sum of the size of the transistor M1 and the size of the integrated circuit 500 when viewed from the X2 direction intersecting the Z2 direction, which is the normal direction of the wiring substrate 810. Therefore, it is possible to increase the release efficiency of the heat released from the side surface of the transistor M1 and the integrated circuit 500 in the heat sink 710.

Figure 17:
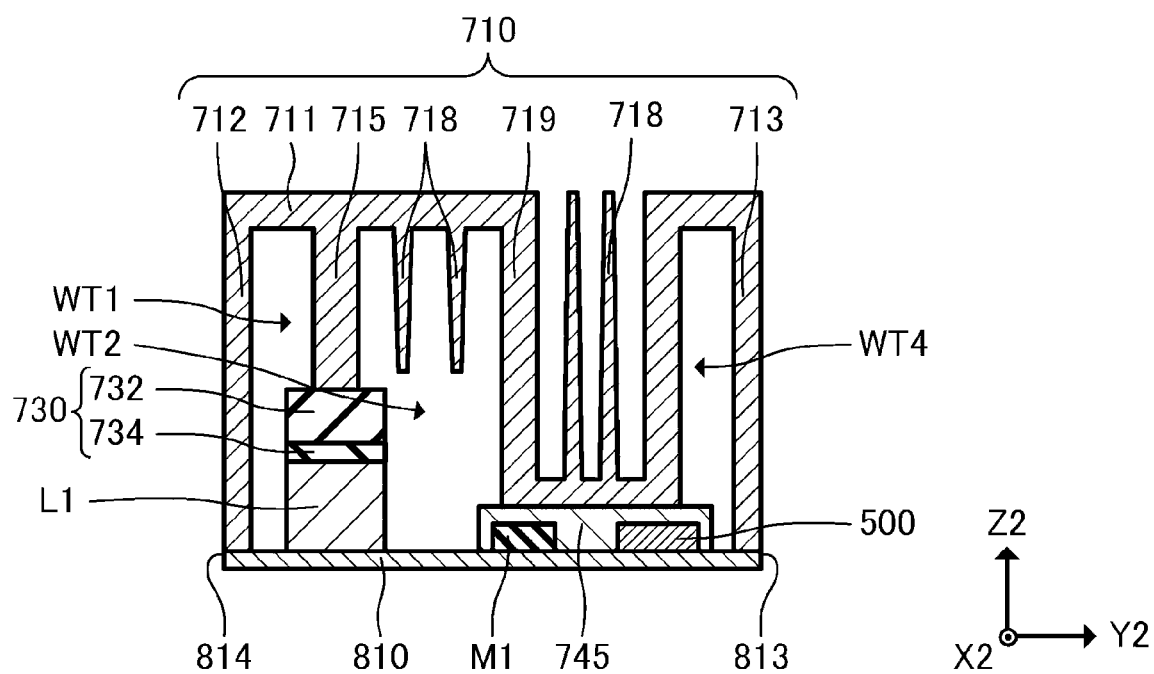
FIG. 17 is a diagram illustrating an example of a cross section of a modification example of the head drive module of the third embodiment.

Here, in the head drive module 10 of the third embodiment, the protruding portion 719 may include a plurality of fin portions 718 protruding from the −Z2 side to the +Z2 side along the Z2 direction. FIG. 17 is a diagram illustrating an example of a cross section of a modification example of the head drive module 10 of the third embodiment. As illustrated in FIG. 17, the protruding portion 719 includes the plurality of fin portions 718 protruding from the −Z2 side to the +Z2 side along the Z2 direction, so that it is possible to further increase the release efficiency of the heat released from the side surface of the transistor M1 and the integrated circuit 500 in the heat sink 710.

Even the liquid discharge device 1 as an example of the electronic device of the third embodiment configured as described above can exhibit the same action and effect as those of the liquid discharge device 1 of the first embodiment. Here, the heat conductive member 745 is an example of a second heat conductive member in the third embodiment.

Although the embodiments and the modification example have been described above, the present disclosure is not limited to these embodiments, and can be implemented in various aspects without departing from the gist thereof. For example, the above embodiments can be combined as appropriate.

The present disclosure includes a configuration substantially the same as the configuration described in the embodiments (for example, a configuration having the same function, method, and result, or a configuration having the same object and effect). In addition, the present disclosure also includes a configuration in which a non-essential part of the configuration described in the embodiments is replaced. In addition, the present disclosure also includes a configuration that exhibits the same action and effect as those of the configuration described in the embodiments or a configuration that can achieve the same object. In addition, the present disclosure also includes a configuration in which a known technique is added to the configuration described in the embodiments.

The following contents are derived from the above-described embodiments.

According to an aspect of the present disclosure, there is provided an electronic device including a substrate, a first electronic component provided on the substrate, a second electronic component provided on the substrate and having a thickness in a normal direction of the substrate smaller than that of the first electronic component, a first heat conductive member in contact with the first electronic component, a second heat conductive member in contact with the second electronic component, and a heat sink attached to the substrate, in which the heat sink includes a base portion provided so as to cover the first electronic component and the second electronic component and attached to the substrate, a first protruding portion that protrudes from the base portion toward the first electronic component and is in contact with the first heat conductive member, and a second protruding portion that protrudes from the base portion toward the second electronic component and is in contact with the second heat conductive member, and a length of the first protruding portion in the normal direction is shorter than a length of the second protruding portion in the normal direction.

According to the electronic device, the heat sink can efficiently release the heat generated in the first electronic component and the second electronic component by randomly changing the length of the first protruding portion and the second protruding portion protruding from the base portion of the heat sink, even when the component heights of the first electronic component and the second electronic component are different.

In an aspect of the electronic device, the device may further include a blower fan, the first electronic component and the second electronic component may be located apart from each other in a direction intersecting the normal direction, and the blower fan may introduce gas to a space between the first electronic component and the second electronic component.

According to the electronic device, the gas introduced by the blower fan improves the release efficiency of heat by the heat sink. As a result, the heat sink can more efficiently release the heat generated in the first electronic component and the second electronic component.

In an aspect of the electronic device, the substrate, the first electronic component, the second electronic component, and the base portion may form a wind tunnel space.

According to the electronic device, the contact area between the first electronic component, the second electronic component, and the outside air is increased by forming the wind tunnel space including the first electronic component and the second electronic component. As a result, the release efficiency of heat of the first electronic component and the second electronic component can be further improved, and the size of the electronic device can be reduced.

In an aspect of the electronic device, a size of the first heat conductive member when viewed from a direction intersecting the normal direction may be larger than a size of the first electronic component when viewed from the direction intersecting the normal direction.

According to the electronic device, a part of the first heat conductive member comes into contact with the side surface of the first electronic component and the substrate provided with the first electronic component by increasing the size of the first heat conductive member larger than the size of the first electronic component. As a result, the heat conduction efficiency generated in the first electronic component by the first heat conductive member is improved, and the release efficiency of heat of the first electronic component is further improved.

In an aspect of the electronic device, a size of the second heat conductive member when viewed from a direction intersecting the normal direction may be larger than a size of the second electronic component when viewed from the direction intersecting the normal direction.

According to the electronic device, a part of the second heat conductive member comes into contact with the side surface of the second electronic component and the substrate provided with the second electronic component by increasing the size of the second heat conductive member larger than the size of the second electronic component. As a result, the heat conduction efficiency generated in the second electronic component by the second heat conductive member is improved, and the release efficiency of heat of the second electronic component is further improved.

In an aspect of the electronic device, the device may further include a third electronic component provided on the substrate and having a thickness in the normal direction smaller than that of the first electronic component, in which at least a part of the second heat conductive member may be in contact with the third electronic component.

According to the electronic device, when the second heat conductive member comes into contact with the third electronic component in addition to the second electronic component, it is possible to release the heat generated in both the second electronic component and the third electronic component without increasing the number of components included in the electronic device.

In an aspect of the electronic device, a size of the second heat conductive member when viewed from a direction intersecting the normal direction may be larger than a sum of a size of the second electronic component and a size of the third electronic component when viewed from the direction intersecting the normal direction.

According to the electronic device, when the size of the second heat conductive member is larger than the sum of the size of the second electronic component and the size of the third electronic component, a part of the second heat conductive member comes into contact with the side surface of the second electronic component, the side surface of the third electronic component, and the substrate provided with the second electronic component and the third electronic component. As a result, the second heat conductive member can more efficiently conduct the heat generated in the second electronic component and the heat generated in the third electronic component. As a result, the release efficiency of heat of the second electronic component and the third electronic component is further improved.

In an aspect of the electronic device, the device may further include a third electronic component provided on the substrate and having a thickness in the normal direction smaller than that of the first electronic component, a third heat conductive member in contact with the third electronic component, and a third protruding portion that protrudes from the base portion toward the third electronic component and is in contact with the third heat conductive member.

According to the electronic device, even when a plurality of electronic components that generate heat are provided on the substrate, the heat sink includes a plurality of protruding portions according to the number of electronic components that generate heat, so that the release efficiency of heat by the heat sink can be increased.

In an aspect of the electronic device, a size of the third heat conductive member when viewed from a direction intersecting the normal direction may be larger than a size of the third electronic component when viewed from the direction intersecting the normal direction.

According to the electronic device, a part of the third heat conductive member comes into contact with the side surface of the third electronic component and the substrate provided with the third electronic component by increasing the size of the third heat conductive member larger than the size of the third electronic component. As a result, the heat conduction efficiency generated in the third electronic component by the third heat conductive member is improved, and the release efficiency of heat of the third electronic component is further improved.

In an aspect of the electronic device, the first electronic component may be an inductor element, the second electronic component may be a transistor element, and the third electronic component may be an integrated circuit device.

According to the electronic device, the heat sink includes a protruding portion corresponding to an electronic component that can generate a large amount of heat, so that the release efficiency of heat by the heat sink can be further improved.

In an aspect of the electronic device, the device may further include a discharge head that discharges liquid.

According to the electronic device, even when the electronic device includes a liquid discharge head that discharges liquid, the heat sink can efficiently release the heat generated in the first electronic component and the second electronic component. Therefore, the possibility that the heat generated in the first electronic component and the second electronic component contributes to the liquid is reduced. As a result, the possibility that the physical properties of the liquid change is reduced, and the discharge accuracy of the liquid in the discharge head is improved. That is, a more remarkable effect is obtained when the electronic device is provided with a discharge head that requires high accuracy in discharging the liquid.

What is claimed is:

1. An electronic device comprising:
a substrate;
a first electronic component provided on the substrate;
a second electronic component provided on the substrate and having a thickness in a normal direction of the substrate smaller than that of the first electronic component;
a first heat conductive member in contact with the first electronic component;
a second heat conductive member in contact with the second electronic component; and
a heat sink attached to the substrate, wherein
the heat sink includes
a base portion provided so as to cover the first electronic component and the second electronic component and attached to the substrate,
a first protruding portion that protrudes from the base portion toward the first electronic component and is in contact with the first heat conductive member, and
a second protruding portion that protrudes from the base portion toward the second electronic component and is in contact with the second heat conductive member, and
a length of the first protruding portion in the normal direction is shorter than a length of the second protruding portion in the normal direction.

2. The electronic device according to claim 1, further comprising:
a blower fan, wherein
the first electronic component and the second electronic component are located apart from each other in a direction intersecting the normal direction, and
the blower fan introduces gas to a space between the first electronic component and the second electronic component.

3. The electronic device according to claim 1, wherein
the substrate, the first electronic component, the second electronic component, and the base portion form a wind tunnel space.

4. The electronic device according to claim 1, wherein
a size of the first heat conductive member when viewed from a direction intersecting the normal direction is larger than a size of the first electronic component when viewed from the direction intersecting the normal direction.

5. The electronic device according to claim 1, wherein
a size of the second heat conductive member when viewed from a direction intersecting the normal direction is larger than a size of the second electronic component when viewed from the direction intersecting the normal direction.

6. The electronic device according to claim 1, further comprising:
a third electronic component provided on the substrate and having a thickness in the normal direction smaller than that of the first electronic component, wherein at least a part of the second heat conductive member is in contact with the third electronic component.

7. The electronic device according to claim 6, wherein a size of the second heat conductive member when viewed from a direction intersecting the normal direction is larger than a sum of a size of the second electronic component and a size of the third electronic component when viewed from the direction intersecting the normal direction.

8. The electronic device according to claim 6, wherein the first electronic component is an inductor element, the second electronic component is a transistor element, and the third electronic component is an integrated circuit device.

9. The electronic device according to claim 1, further comprising:

a third electronic component provided on the substrate and having a thickness in the normal direction smaller than that of the first electronic component;

a third heat conductive member in contact with the third electronic component; and a third protruding portion that protrudes from the base portion toward the third electronic component and is in contact with the third heat conductive member.

10. The electronic device according to claim 9, wherein a size of the third heat conductive member when viewed from a direction intersecting the normal direction is larger than a size of the third electronic component when viewed from the direction intersecting the normal direction.

11. The electronic device according to claim 1, further comprising:

a discharge head that discharges liquid.

* * * * *